(12) United States Patent
Tomino et al.

(10) Patent No.: US 8,202,759 B2
(45) Date of Patent: Jun. 19, 2012

(54) MANUFACTURING METHOD OF ORGANIC SEMICONDUCTOR DEVICE

(75) Inventors: Ken Tomino, Tokyo-to (JP); Masanao Matsuoka, Tokyo-to (JP); Tomomi Suzuki, Tokyo-to (JP); Hiroki Maeda, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 12/863,538

(22) PCT Filed: Jan. 21, 2009

(86) PCT No.: PCT/JP2009/050869
§ 371 (c)(1),
(2), (4) Date: Nov. 10, 2010

(87) PCT Pub. No.: WO2009/093606
PCT Pub. Date: Jul. 30, 2009

(65) Prior Publication Data
US 2011/0053313 A1    Mar. 3, 2011

(30) Foreign Application Priority Data
Jan. 22, 2008  (JP) .................... 2008-011500

(51) Int. Cl.
*H01L 51/40* (2006.01)
(52) U.S. Cl. ............ 438/99; 257/E21.007; 257/E51.008

(58) Field of Classification Search .................... 438/99, 438/151, 149; 257/E21.007, E21.018, E51.005
See application file for complete search history.

(56) References Cited

U.S. PATENT DOCUMENTS
8,017,431 B2 *  9/2011  Nomoto .................... 438/99

FOREIGN PATENT DOCUMENTS
| JP | 2006-339473 A | 12/2006 |
| JP | 2007-096288 A | 4/2007 |
| JP | 2007-115804 A | 5/2007 |
| WO | 03/067667 A1 | 8/2003 |

* cited by examiner

*Primary Examiner* — Walter Lindsay, Jr.
(74) *Attorney, Agent, or Firm* — Ladas & Parry LLP

(57) ABSTRACT

The present invention provides a manufacturing method of an organic semiconductor device comprising a step of transferring an organic semiconductor layer to a gate insulation layer by a thermal transfer at a liquid crystal phase transition temperature of a liquid crystalline organic semiconductor material, and the step uses: an organic semiconductor layer-transferring substrate comprising a parting substrate having parting properties, and the organic semiconductor layer formed on the parting substrate and containing the liquid crystalline organic semiconductor material; and a substrate for forming an organic semiconductor device comprising a substrate, a gate electrode formed on the substrate, and the gate insulation layer formed to cover the gate electrode and having alignment properties which are capable of aligning the liquid crystalline organic semiconductor material on a surface of the gate insulation layer.

10 Claims, 12 Drawing Sheets

MANUFACTURING METHOD OF ORGANIC SEMICONDUCTOR DEVICE

TECHNICAL FIELD

The present invention relates to a manufacturing method of an organic semiconductor device having a technical structure where an organic transistor is formed on a substrate.

BACKGROUND ART

The semiconductor transistor typified by TFT shows the current trend towards spreading of its applications along with the development of display devices. Such a semiconductor transistor functions as a switching element when the electrodes are connected through a semiconductor material.

Here, as shown in FIGS. 13A and 13B, a transistor 100 using the semiconductor material normally comprises: a gate electrode 101, a gate insulation layer 102 for insulating the gate electrode 101, a semiconductor layer 103 made of the semiconductor material, a source electrode 104 and a drain electrode 105 formed so as to contact to the semiconductor layer 103. As such transistor, a transistor having a bottom-gate structure where the gate electrode 101 is provided to the under surface side of the semiconductor layer 103 (FIG. 13A) and a transistor having a top-gate structure where the gate electrode 101 is provided to the upper surface side of the semiconductor layer 103 (FIG. 13B) are known.

As the semiconductor material used for the semiconductor transistor, inorganic semiconductor materials such as silicon (Si), gallium arsenic (GaAs) and indium gallium arsenic (InGaAs) are conventionally used. Semiconductor transistors using such an inorganic semiconductor are also used for display TFT array substrates of liquid crystal display devices which have been widely spread in recent years. On the other hand, organic semiconductor materials made of organic compounds are known as the semiconductor material.

Transistors using such organic semiconductor materials have an advantage in that: they are allowed to be increased in area at a lower cost than those using the inorganic semiconductor materials, and they can be formed on a flexible plastic substrate and are also stable against mechanical impact. Therefore, active studies are being made as to technologies regarding the organic semiconductor materials, which is assumed to be applied display devices, such as flexible displays typified by electronic papers, in the next generation. In particular, focuses on studies of a manufacturing method which improves the transistor performance and allows high productivity are made.

In these circumstances, Patent Literature 1 discloses a method of forming an organic transistor by using a liquid crystalline organic semiconductor material as an organic semiconductor material which constitutes an organic semiconductor layer and coating a coating solution containing the organic semiconductor material. As such method allows the liquid crystalline organic semiconductor material to align in the organic semiconductor layer, it has an advantage in improving a performance of the organic transistor to be manufactured. In manufacturing a high-performance organic semiconductor device having high industrial versatility, organic transistor to be manufactured is desired to have a technical structure where plural organic transistors are provided on a substrate. However, the method of Patent Literature 1 has a problem that it is very difficult for the method to manufacture an organic semiconductor device which has such technical structure because it is difficult to form plural organic semiconductor layers in pattern.

To respond such problem, Patent Literature 2 discloses a method of forming an organic transistor by using a laminate, which has a technical structure where an organic semiconductor layer containing a liquid crystalline organic semiconductor material aligned regularly on a substrate provided with an alignment film, and by transferring the organic semiconductor layer from the laminate. According to this method, by transferring the organic semiconductor layers in pattern, it is possible to manufacture an organic semiconductor device which has a technical structure where plural organic transistors are provided on a substrate. However, it is still difficult to transfer an organic semiconductor layers in highly-precise pattern in such method. Further, to begin with, when an organic transistor is manufactured by such a method, there is a problem of lowering a performance of the organic transistor to be manufactured because alignment of the liquid crystalline organic semiconductor material in the organic semiconductor layer is deteriorated due to the heating of or pressing to the organic semiconductor layer at the time of transferring the organic semiconductor layer. Although possibility of avoiding such problem remains by transferring the organic semiconductor layer under milder conditions, such conditions will largely limit the transferring conditions, and thereby resulting in raising another problem of making it impossible to manufacture an organic transistor with high productivity.

Patent Literature 1: Japanese Patent Application Laid-open (JP-A) No. 2006-339473

Patent Literature 2: JP-A No. 2007-96288

DISCLOSURE OF INVENTION

Technical Problem

The present invention is attained in view of the above-mentioned problems, and a main object thereof is to provide a manufacturing method of an organic semiconductor device which can manufacture a highly-productive organic semiconductor device having excellent transistor characteristics by thermally transferring the organic semiconductor layer in highly-precise pattern.

Solution to Problem

To solve the above-mentioned problems, the present invention provides a manufacturing method of an organic semiconductor device comprising a step of transferring an organic semiconductor layer to a gate insulation layer by a thermal transfer at a liquid crystal phase transition temperature of a liquid crystalline organic semiconductor material, and the step uses: an organic semiconductor layer-transferring substrate comprising a parting substrate having a parting property, and the organic semiconductor layer formed on the parting substrate and containing the liquid crystalline organic semiconductor material; and a substrate for forming an organic semiconductor device comprising a substrate, a gate electrode formed on the substrate, and the gate insulation layer formed to cover the gate electrode and having an alignment property which is capable of aligning the liquid crystalline organic semiconductor material on a surface of the gate insulation layer.

According to the present invention, the liquid crystalline organic semiconductor material which can be aligned regularly is used as a material to constitute the organic semiconductor layer, and a temperature at the time of thermal transfer during the organic semiconductor layer-transfer step, in which the organic semiconductor layer is thermally transferred to the gate insulation layer of the substrate for forming an organic semiconductor device, is the liquid crystal phase transition temperature of the liquid crystalline organic semiconductor material. Thereby, it becomes possible to transfer a phase of the liquid crystalline organic semiconductor material to the liquid crystal phase at the time of thermal transferring the organic semiconductor layer. As a result, the liquid crystalline organic semiconductor material can be aligned regularly in the organic semiconductor layer after the transfer.

Further, since the transferred organic semiconductor layer is to be provided to the surface of the gate insulation layer which has alignment properties, it becomes possible to stabilize the alignment properties of the liquid crystalline organic semiconductor material of the organic semiconductor layer after the transfer.

Moreover, in the present invention, by setting a temperature at the time of thermal transferring the organic semiconductor layer to the gate insulation layer to the liquid crystal phase transition temperature of the liquid crystalline organic semiconductor material, it becomes possible to improve the parting properties of the organic semiconductor layer from the parting substrate. Accordingly, it becomes possible to transfer the organic semiconductor layer in highly-precise pattern to the gate insulation layer.

As explained, according to the present invention, it is possible to manufacture a highly-productive organic semiconductor device having excellent transistor characteristics by transferring the organic semiconductor layer in highly-precise pattern.

Further, to solve the above-mentioned problems, the present invention provides a manufacturing method of an organic semiconductor device comprising a step of transferring an organic semiconductor layer to a substrate for forming an organic semiconductor device by a thermal transfer at a liquid crystal phase transition temperature of a liquid crystalline organic semiconductor material, and the step uses: an organic semiconductor layer-transferring substrate comprising a parting substrate having a parting property, and the organic semiconductor layer formed on the parting substrate and containing the liquid crystalline organic semiconductor material; and the substrate for forming an organic semiconductor device having an alignment property which is capable of aligning the liquid crystalline organic semiconductor material on a surface of the substrate for forming an organic semiconductor device.

According to the present invention, the liquid crystalline organic semiconductor material which can be aligned regularly is used as a material to constitute the organic semiconductor layer, and a temperature at the time of thermal transfer during the organic semiconductor layer-transfer step, in which the organic semiconductor layer is thermally transferred to the substrate for forming an organic semiconductor device having alignment properties on its surface, is the liquid crystal phase transition temperature of the liquid crystalline organic semiconductor material. Thereby, it becomes possible to transfer a phase of the liquid crystalline organic semiconductor material to the liquid crystal phase at the time of thermal transferring the organic semiconductor layer. As a result, the liquid crystalline organic semiconductor material can be aligned regularly in the organic semiconductor layer after the transfer.

Further, since the transferred organic semiconductor layer is to be provided to the surface of the substrate for forming an organic semiconductor device which has alignment properties, it becomes possible to stabilize the alignment properties of the liquid crystalline organic semiconductor material of the organic semiconductor layer after the transfer.

Moreover, in the present invention, by setting a temperature at the time of thermal transferring the organic semiconductor layer to the surface of the substrate for forming an organic semiconductor device to the liquid crystal phase transition temperature of the liquid crystalline organic semiconductor material, it becomes possible to improve the parting properties of the organic semiconductor layer from the parting substrate. Accordingly, according to the present invention, it becomes possible to transfer the organic semiconductor layer in highly-precise pattern to the surface of the substrate for forming an organic semiconductor device.

As explained, according to the present invention, it is possible to manufacture a highly-productive organic semiconductor device having excellent transistor characteristics by transferring the organic semiconductor layer in highly-precise pattern.

In the present invention, it is preferable that the gate insulation layer is capable of vertically-aligning the liquid crystalline organic semiconductor material on the surface of the gate insulation layer. Since the gate insulation layer has such vertically-aligning properties, it becomes possible to vertically-align the liquid crystalline organic semiconductor material in the organic semiconductor layer transferred to the gate insulation layer. Thereby, charge mobility in the in-plane direction of the transferred organic semiconductor layer is improved and it becomes possible to manufacture an organic semiconductor device having further excellent transistor characteristics.

In the present invention, it is preferable that the substrate for forming an organic semiconductor device is capable of vertically-aligning the liquid crystalline organic semiconductor material on the surface of the substrate for forming an organic semiconductor device. Since the substrate for forming an organic semiconductor device has such vertically-aligning properties, it becomes possible to vertically-align the liquid crystalline organic semiconductor material in the organic semiconductor layer transferred to the substrate for forming an organic semiconductor device. Thereby, charge mobility in the in-plane direction of the transferred organic semiconductor layer is improved and it becomes possible to manufacture an organic semiconductor device having further excellent transistor characteristics.

Further, in the present invention, it is preferable that a surface of the parting substrate has a lower surface energy than a surface energy of the surface of the gate insulation layer. Thereby, it becomes possible to further improve the parting properties of the organic semiconductor layer from the parting substrate. As a result, it becomes possible to transfer the organic semiconductor layer in more highly-precise pattern in the organic semiconductor layer-transfer step of the present invention.

Still further, in the present invention, it is preferable that a surface of the parting substrate has a lower surface energy than a surface energy of the surface of the substrate for forming an organic semiconductor device. Thereby, it becomes possible to further improve the parting properties of the organic semiconductor layer from the parting substrate. As a result, it becomes possible to transfer the organic semiconductor layer in more highly-precise pattern in the organic semiconductor layer-transfer step of the present invention.

Moreover, in the present invention, it is preferable that the organic semiconductor layer-transfer step is to thermally transfer the organic semiconductor layer in pattern. Thereby, a technical structure of an organic semiconductor device manufactured by the present invention can be made to a structure where plural organic transistors are provided on a substrate. Accordingly, it is possible to make an organic semiconductor device manufactured by the present invention excellent in industrial versatility.

Advantageous Effects of Invention

The manufacturing method of an organic semiconductor device of the present invention attains the effect of enabling the manufacturing of a highly-productive organic semiconductor device having excellent transistor characteristics by transferring the organic semiconductor layer in highly-precise pattern.

Figure 1:
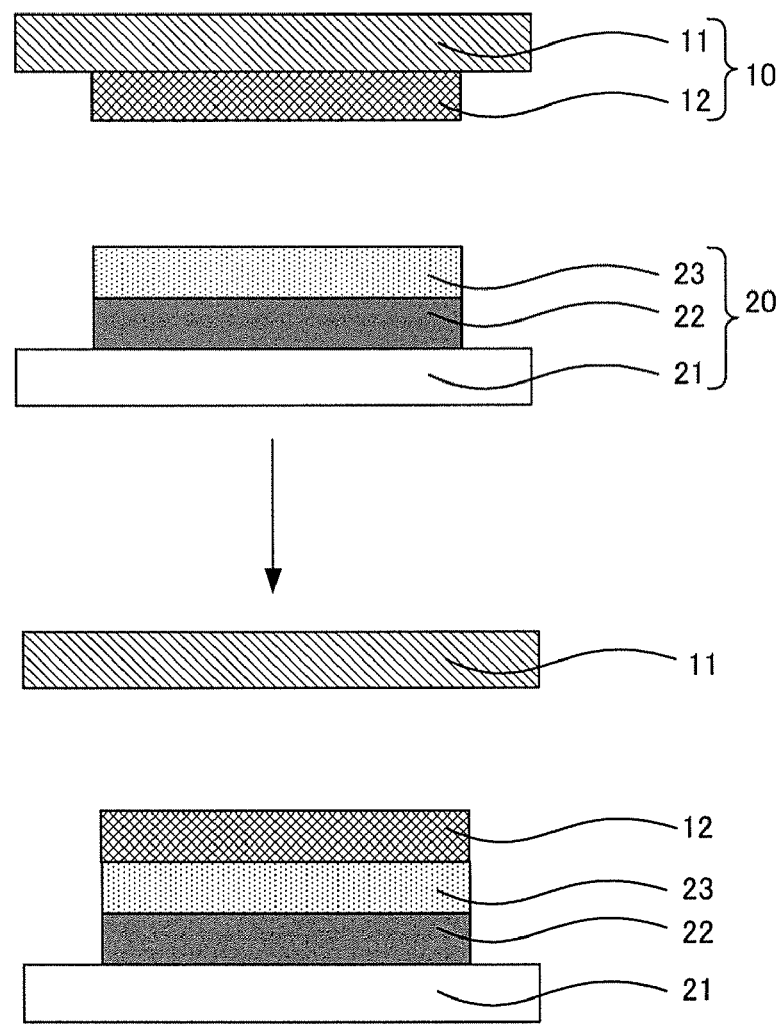
FIG. 1 is a schematic view illustrating one example of the manufacturing method of an organic semiconductor device used in the first embodiment for the present invention.

| Description of Reference Numerals | |
|---|---|
| 10 | Organic semiconductor layer-transferring substrate |
| 11 | Parting substrate |
| 12 | Organic semiconductor layer |
| 13 | Source electrode |
| 14 | Drain electrode |
| 15 | Gate insulation layer |
| 16 | Gate electrode |
| 17 | Passivation layer |
| 20 | Substrate for forming an organic semiconductor device |
| 21 | Substrate |
| 22 | Gate electrode |
| 23 | Gate insulation layer |
| 24 | Source electrode |
| 25 | Drain electrode |
| 100 | Organic transistor |
| 101 | Gate electrode |
| 102 | Gate insulation layer |
| 103 | Organic semiconductor layer |
| 104 | Source electrode |
| 105 | Drain electrode |

MODES FOR CARRYING OUT THE INVENTION

The manufacturing method of an organic semiconductor device of the present invention can be divided into two embodiments according to a technical structure of an organic semiconductor device to be manufactured.

Hereinafter, the manufacturing method of an organic semiconductor device of the present invention will be explained in order by each embodiment.

A. First Embodiment for Manufacturing Method of Organic Semiconductor Device

First, the first embodiment for manufacturing method of organic semiconductor device of the present invention will be explained. The manufacturing method of an organic semiconductor device of the present embodiment is to manufacture an organic semiconductor device having a technical structure where a bottom-gate type organic transistor is provided on a substrate.

In other words, the manufacturing method of an organic semiconductor device of the present embodiment comprises a step of transferring an organic semiconductor layer to a gate insulation layer by a thermal transfer at a liquid crystal phase transition temperature of a liquid crystalline organic semiconductor material, and the step uses: an organic semiconductor layer-transferring substrate comprising a parting substrate having parting properties, and the organic semiconductor layer formed on the parting substrate and containing the liquid crystalline organic semiconductor material; and a substrate for forming an organic semiconductor device comprising a substrate, a gate electrode formed on the substrate, and the gate insulation layer formed to cover the gate electrode and having alignment properties which are capable of aligning the liquid crystalline organic semiconductor material on a surface of the gate insulation layer.

Such manufacturing method of an organic semiconductor device of the present embodiment will be explained with reference to the drawings. FIG. 1 is a schematic view illustrating one example of the manufacturing method of an organic semiconductor device of the present embodiment. As illustrated in FIG. 1, the manufacturing method of an organic semiconductor device of the present invention comprises a step of transferring an organic semiconductor layer 12 to a gate insulation layer 23, and the step uses: an organic semiconductor layer-transferring substrate 10 comprising a parting substrate 11 having parting properties, and the organic semiconductor layer 12 formed on the parting substrate 11 and containing the liquid crystalline organic semiconductor material; and a substrate for forming an organic semiconductor device 20 comprising a substrate 21, a gate electrode 22 formed on the substrate 21, and the gate insulation layer 23 formed to cover the gate electrode 22 and having alignment properties which are capable of aligning the liquid crystalline organic semiconductor material on a surface of the gate insulation layer 23.

In such example, the manufacturing method of an organic semiconductor device of the present embodiment is conducted by setting a temperature at the time of thermal transferring the organic semiconductor layer 12 to the gate insulation layer 23 to the liquid crystal phase transition temperature of the liquid crystalline organic semiconductor material in the organic semiconductor layer-transfer step.

According to the present embodiment, the liquid crystalline organic semiconductor material which can be aligned regularly is used as a material to constitute the organic semiconductor layer, and a temperature at the time of thermal transfer during the organic semiconductor layer-transfer step, in which the organic semiconductor layer is thermally transferred to the gate insulation layer of the substrate for forming an organic semiconductor device, is the liquid crystal phase transition temperature of the liquid crystalline organic semiconductor material. Thereby, it becomes possible to transfer a phase of the liquid crystalline organic semiconductor material to the liquid crystal phase at the time of thermal transferring the organic semiconductor layer. As a result, the liquid crystalline organic semiconductor material can be aligned regularly in the organic semiconductor layer after the transfer.

Further, since the transferred organic semiconductor layer is to be provided to the surface of the gate insulation layer which has alignment properties, it becomes possible to stabilize the alignment properties of the liquid crystalline organic semiconductor material of the organic semiconductor layer after the transfer.

Moreover, in the present embodiment, by setting a temperature at the time of thermal transferring the organic semiconductor layer to the gate insulation layer to the liquid crystal phase transition temperature of the liquid crystalline organic semiconductor material, it becomes possible to improve the parting properties of the organic semiconductor layer from the parting substrate. Accordingly, according to the present embodiment, it becomes possible to transfer the organic semiconductor layer in highly-precise pattern to the gate insulation layer.

As explained, according to the present embodiment, by transferring the organic semiconductor layer in highly-precise pattern, it becomes possible to manufacture a highly-productive organic semiconductor device having excellent transistor characteristics.

The manufacturing method of an organic semiconductor device of the present embodiment comprises at least the organic semiconductor layer-transfer step and may comprise other step as needed.

Hereinafter, each step of the present embodiment will be explained.

1. Organic Semiconductor Layer-Transfer Step

First, an organic semiconductor layer-transfer step used in the present embodiment will be explained. The present step is a step of transferring an organic semiconductor layer to a gate insulation layer by a thermal transfer at a liquid crystal phase transition temperature of a liquid crystalline organic semiconductor material, and the step uses: an organic semiconductor layer-transferring substrate comprising a parting substrate having parting properties, and the organic semiconductor layer formed on the parting substrate and containing the liquid crystalline organic semiconductor material; and a substrate for forming an organic semiconductor device comprising a substrate, a gate electrode formed on the substrate, and the gate insulation layer formed to cover the gate electrode and having alignment properties which are capable of aligning the liquid crystalline organic semiconductor material on a surface of the gate insulation layer.

Hereinafter, the organic semiconductor layer-transfer step used in the present embodiment will be explained in detail.

(1) Organic Semiconductor Layer-Transferring Substrate

First, an organic semiconductor layer-transferring substrate used in the present step will be explained. The organic semiconductor layer-transferring substrate used in the present step comprises at least a parting substrate having parting properties, and the organic semiconductor layer formed on the parting substrate and containing the liquid crystalline organic semiconductor material.

(a) Organic Semiconductor Layer

The organic semiconductor layer will be explained. The organic semiconductor layer contains the liquid crystalline organic semiconductor material and is to be thermal transferred in the present step to the gate insulation layer of the substrate for forming an organic semiconductor device to be explained later.

A liquid crystalline organic semiconductor material used for the organic semiconductor layer is not particularly limited as long as it is a material having semiconductor properties and exhibits a liquid crystal phase at the predetermined temperature. The material can be appropriately selected according to factors such as an application of an organic semiconductor device manufactured in the present embodiment. In particular, the liquid crystalline organic semiconductor material used in the present embodiment preferably has a liquid crystal phase transition temperature, at which the liquid crystalline organic semiconductor material shows a liquid crystal phase, of 450° C. or lower, more preferably 300° C. or lower, and further more preferably 200° C. or lower.

Here, the liquid crystal phase transition temperature denotes a temperature at which the liquid crystalline organic semiconductor material exhibits a liquid crystal phase. Such liquid crystal phase transition temperature is measured by, for example, a thermal analysis by differential scanning calorimetry (DSC) or a texture observation under a polarizing microscope.

As the liquid crystalline organic semiconductor material used in the present embodiment, a high-molecular type liquid crystalline organic semiconductor material and a low-molecular type liquid crystalline organic semiconductor material are cited. In the present embodiment, either of the high-molecular type liquid crystalline organic semiconductor material and the low-molecular type liquid crystalline organic semiconductor material can be suitably used.

As examples of the high-molecular type liquid crystalline organic semiconductor material, the followings can be cited: polythiophene derivatives, polyphenylene derivatives, polyaniline derivatives, polyphenylenevinylene derivatives, polythenylenevinylene derivatives, polyacetylene derivatives, polydiacetylene derivatives, poly(triphenylamine) derivatives, copolymerized derivatives of triphenylamine and phenylenevinylene, copolymerized derivatives of thiophene and phenylene, copolymerized derivatives of thiophene and thieno thiophene, and copolymerized derivatives of thiophene and fluorine.

As examples of the low-molecular type liquid crystalline organic semiconductor material, the followings can be cited: oligochalcogenophene derivatives; oligophenylene derivatives; co-oligomer derivatives of chalcogenophene and phenylene; derivatives of a condensed compound of chalcogenophene such as tetrathienoacene; derivatives of a condensed compound of chalcogenophene and phenylene; condensed polycyclic hydrocarbon derivatives such as anthracene, tetracene, pentacene, pyrene, triphenylene, and coronene; co-oligomer derivatives of chalcogenophene and a condensed polycyclic hydrocarbon; phthalocyanine derivatives, porphyrin derivatives, tetrathiofulvalene derivatives, triphenylamine derivatives, tetracyanoquinodimethane derivatives, benzoquinone derivatives, thiazolothiazole derivatives, and fullerene derivatives.

The liquid crystalline organic semiconductor material used in the present embodiment may be only one type or plural.

A thickness of the organic semiconductor layer used in the present embodiment is not particularly limited as long as it can provide the desired semiconductor properties to the organic semiconductor layer according to factors such as a type of the liquid crystalline organic semiconductor material. In particular, the thickness of the organic semiconductor layer used in the present embodiment is preferably from 1 nm to 1000 nm, more preferably within the range of 1 nm to 500 nm, and further more preferably within the range of 1 nm to 300 nm.

(b) Parting Substrate

Next, the parting substrate will be explained. The parting substrate used in the present embodiment has parting properties to the above-mentioned organic semiconductor layer.

Here, the phrase that the parting substrate used in the present embodiment has "parting properties" means that the adhesion properties of the parting substrate surface to the organic semiconductor layer is smaller than the adhesion properties of the gate insulation layer of the substrate for forming an organic semiconductor device to be explained later to the organic semiconductor layer. In particular, the parting substrate used in the present invention preferably has a lower surface energy than that of the gate insulation layer. Thereby, it becomes possible to realize high parting properties of the parting substrate to the organic semiconductor layer.

When a parting substrate having a lower surface energy than that of the gate insulation layer is used as the parting substrate of the present embodiment, the difference between the surface energy of the parting substrate and the surface energy of the gate insulation layer is not particularly limited and can be appropriately decided according to factors such as the type of the liquid crystalline organic semiconductor material used in the organic semiconductor layer and liquid crystal phase transition temperature. In particular, it is preferably $0.1(10^{-3}$ N/m) or more, more preferably $0.5(10^{-3}$ N/m) or more, and further more preferably $1.0 (10^{-3}$ N/m) or more. By setting the surface energy to the above-mentioned range, it becomes possible in the manufacturing method of an organic semiconductor device of the present invention to improve the transferring properties of the organic semiconductor layer at the time of transferring to the gate insulation layer and to transfer the organic semiconductor layer in more highly-precise pattern in the present step.

A technical structure of the parting substrate used in the present embodiment is not particularly limited as long as it can realize the above-mentioned parting properties and an optional technical structure can be used according to factors such as the type of the liquid crystalline organic semiconductor material used for the organic semiconductor layer. As examples of the parting substrate used in the present embodiment, a technical structure made of a single substrate made of a material having the parting properties (first structure) and a technical structure comprising an optional substrate and a parting layer formed on the substrate and made of a material having the parting properties (second structure) are cited. In the present embodiment, a parting substrate having either of the technical structures can be suitably used.

Figure 2A:
FIGS. 2A and 2B are schematic cross-sectional views each illustrating one example of a technical structure of the parting substrate used in the present invention.
Figure 2B:
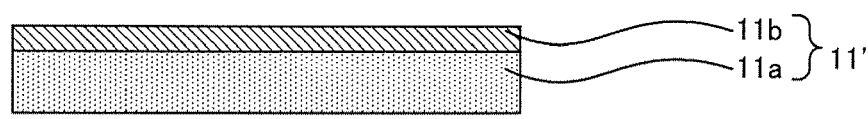

Such technical structure of the parting substrate will be explained with reference to the drawings. FIGS. 2A and 2B are schematic cross-sectional views each illustrating one example of a technical structure of the parting substrate used in the present embodiment. As shown in FIGS. 2A and 2B, parting substrates 11 and 11' used in the present embodiment may have a technical structure where the parting substrate is a single substrate made of a material having parting properties (FIG. 2A), or a technical structure where a parting layer 11b made of a material having parting properties is formed on an optional substrate 11a (FIG. 2B).

As examples of the parting substrate having the first structure, the followings can be cited: a fluorinated resin substrate typified by polytetrafluoroethylene (PTFE), a silicon resin substrate typified by polysiloxane, an elastic rubber substrate and a substrate made of a denatured product thereof typified by chloroprene rubber, nitrile rubber, ethylene-propylene rubber, natural rubber, styrene rubber, isoprene rubber, and butadiene rubber.

On the other hand, the parting substrate having the second structure is the substrate where the parting layer is formed on an optional substrate. As examples of the parting material used for the parting layer, the followings can be cited: fluorinated resin typified by polytetrafluoroethylene, polytetrafluoroethylene (PTFE), a silicone resin typified by polysiloxane, and a resin containing a fluorinated or silicone-based additives.

The optional substrate used for the second technical structure explained above is not particularly limited as long as it can support the parting substrate. As examples of such substrate, the followings can be cited: a silicon-based resin substrate, fluorinated-based resin substrate, an elastic rubber substrate typified by chloroprene rubber, nitrile rubber, ethylene-propylene rubber, natural rubber, styrene rubber, isoprene rubber, and butadiene rubber, and a substrate made of polyethylene terephthalate (PET), polyethylene naphthalate (PEN), polyether sulfone (PES), polyetherimide, polyether ether ketone, polyphenylsulfide, polyacrylate, polyimide, polycarbonate (PC), cellulose triacetate (TAC), cellulose acetate propionate (CAP). Further, a substrate may be made of an inorganic material.

(c) Other Structure

The organic semiconductor layer-transferring substrate used in the present step comprises at least the parting substrate and the organic semiconductor layer, and may have other technical structure as needed. As examples of such structure, a passivation layer formed between the parting layer and the organic semiconductor layer, and a source electrode and drain electrode formed so as to contact to the organic semiconductor layer are cited.

Figure 3A:
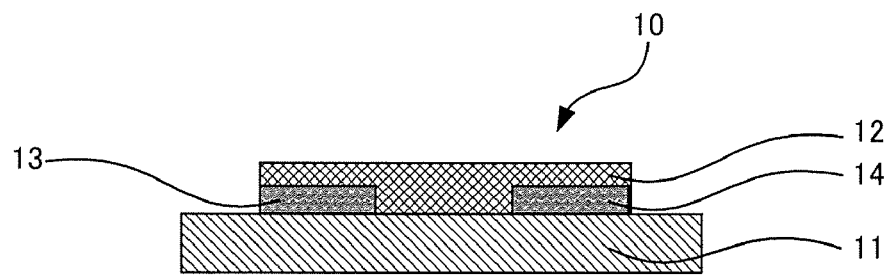
FIGS. 3A and 3B are schematic cross-sectional views each illustrating one example of the organic semiconductor layer-transferring substrate used in the first embodiment for manufacturing method of organic semiconductor device of the present invention.
Figure 3B:
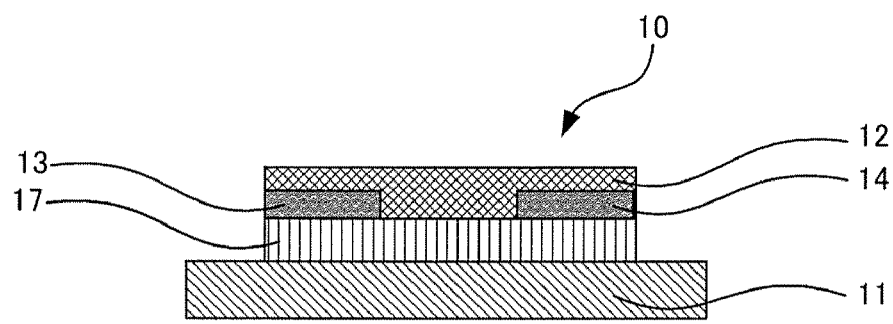

A case when the passivation layer or the source electrode and drain electrode is formed in the organic semiconductor layer-transferring substrate will be explained with reference with the drawings. FIGS. 3A and 3B are schematic cross-sectional views each illustrating one example when the organic semiconductor layer-transferring substrate of the present step has the source electrode and drain electrode formed. As shown in FIG. 3A, an organic semiconductor layer-transferring substrate 10 used in the present step may have a source electrode 13 and a drain electrode 14 formed between the parting substrate 11 and the organic semiconductor layer 12 so as to contact to the organic semiconductor layer 12.

Further, in this case, a passivation layer 17 may be formed between the source electrode 13 and the drain electrode 14, and the parting substrate 11 (FIG. 3B).

Figure 4A:
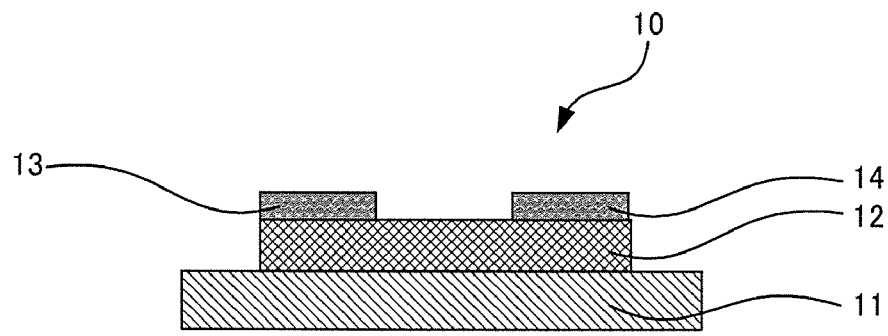
FIGS. 4A and 4B are schematic cross-sectional views each illustrating another example of the organic semiconductor layer-transferring substrate used in the first embodiment for manufacturing method of organic semiconductor device of the present invention.
Figure 4B:
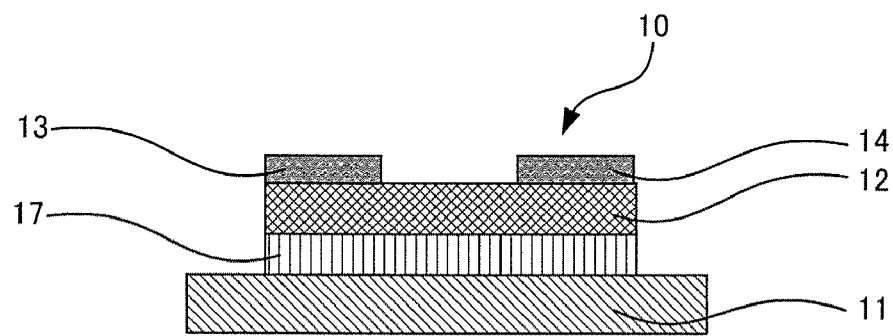

Still further, FIGS. 4A and 4B are schematic cross-sectional views each illustrating another example when the organic semiconductor layer-transferring substrate of the present step has the source electrode and drain electrode formed. As shown in FIG. 4A, an organic semiconductor layer-transferring substrate used in the present step may have a source electrode 13 and a drain electrode 14 formed on the organic semiconductor layer 12 so as to contact to the organic semiconductor layer 12. Moreover, in this case, a passivation layer 17 may be formed between the organic semiconductor layer 12 and the parting substrate 11 (FIG. 4B).

A constituting material for the source electrode and the drain electrode is not particularly limited as long as it is a conductive material having the desired conductivity. As examples of such conductive material, an inorganic material such as Ag, Au, Ta, Ti, Al, Zr, Cr, Nb, Hf, Mo, a Mo—Ta alloy, ITO, and IZO, and an organic material having conductivity such as PEDOT/PSS are cited.

On the other hand, constituting material for the passivation layer is not particularly limited as long as it can prevent to the desired extent the organic semiconductor layer of the organic semiconductor device manufactured in the present embodiment being exposed to the moisture or the like in the air. As examples of such material, resin materials such as an acryl type resin, a phenol type resin, a fluorine type resin, an epoxy type resin, a cardo-type resin, a vinyl type resin, an imide type resin, and a novolac resins are cited.

(2) Substrate for Forming Organic Semiconductor Device

Next, a substrate for forming an organic semiconductor device used in the present embodiment will be explained. The substrate for forming an organic semiconductor device used in the present embodiment comprises at least a substrate, a gate electrode formed on the substrate, and the gate insulation layer formed to cover the gate electrode and having alignment properties which are capable of aligning the liquid crystalline organic semiconductor material on a surface of the gate insulation layer.

Hereinafter, such substrate for forming an organic semiconductor device will be explained in detail.

(a) Substrate

First, the substrate will be explained. The substrate used in the present embodiment is to support the gate electrode and the gate insulation layer to be explained later.

An optional substrate can be suitably selected for the substrate used in the present embodiment according to factors such as an application of an organic semiconductor device manufactured by the present embodiment. Such substrate may be a rigid substrate having no flexibility such as a glass substrate, or a flexible substrate having flexibility such as a film made of plastic resin. In the present embodiment, either of the rigid substrate and the flexible substrate may be suitable used, but it is preferable to use the flexible substrate. By using such flexible substrate, it becomes possible to conduct the manufacturing method of an organic semiconductor device of the present embodiment by a Roll to Roll process. As a result, it becomes possible to manufacture an organic semiconductor device at higher productivity.

Here, as examples of the plastic resin, PET, PEN, PES, PI, PEEK, PC, PPS, and PEI are cited.

Further, the substrate used in the present embodiment may be a single layer or has a technical structure where plural layers are laminated. As an example of the substrate having a technical structure where plural layers are laminated, a substrate having a technical structure where barrier layers made of a metal material(s) are laminated on a substrate made of the plastic resin is cited. Here, while the substrate made of the plastic resin has an advantage of making an organic semiconductor device manufactured by the present embodiment a flexible organic semiconductor device which has flexibility, it is also pointed out that it has a disadvantage of being easily damaged on its surface. Nonetheless, by using the substrate having barrier layers laminated, the above-mentioned disadvantage is resolved even when the substrate made of the plastic resin is used, and thus becomes advantageous.

A thickness of the substrate used in the present embodiment is generally preferable to be 1 mm or less, and more preferable to be within the range of 1 μm to 700 μm.

When the substrate used in the present embodiment has the technical structure where plural layers are laminated, the above-mentioned thickness denotes the total thickness of each layer.

(b) Gate Electrode

Next, the gate electrode will be explained. The gate electrode used in the present embodiment is formed on the substrate. The gate electrode used in the present embodiment is not particularly limited as long as it is made of a material having the desired conductivity. In the present embodiment, a metal material used for a general organic transistor can be used for the gate electrode and the following examples are cited: an inorganic material such as Ag, Au, Ta, Ti, Al, Zr, Cr, Nb, Hf, Mo, a Mo—Ta alloy, ITO, and IZO, and an organic material having conductivity such as PEDOT/PSS.

(c) Gate Insulation Layer

Next, the gate insulation layer will be explained. The gate insulation layer used in the present embodiment is formed to cover the gate electrode and has a function to insulate the gate electrode and other layer(s). Further, the gate insulation layer used in the present embodiment has alignment properties which are capable of aligning the liquid crystalline organic semiconductor material on a surface of the gate insulation layer. In other words, the manufacturing method of an organic semiconductor device of the present embodiment comprises the organic semiconductor layer-transfer step to thermal transfer the above-mentioned organic semiconductor layer of the organic semiconductor layer-transferring substrate to the gate insulation layer of the substrate for forming an organic semiconductor device and the thermal transfer temperature is set to the liquid crystal phase transition temperature of the liquid crystalline organic semiconductor material contained in the organic semiconductor layer. The gate insulation layer used in the present embodiment has a function to regularly align the liquid crystalline organic semiconductor material in the organic semiconductor layer transferred onto the gate insulation layer. Accordingly, in the present embodiment, since the gate insulation layer is formed on the substrate for forming an organic semiconductor device, it is possible to align the liquid crystalline organic semiconductor material at the time of thermal transferring the organic semiconductor layer. Thus, there will be no need to consider the possibility of damaging the alignment properties of the liquid crystalline organic semiconductor material at the time of thermal transfer. Further, since the gate insulation layer is formed on the substrate for forming an organic semiconductor device, the organic semiconductor device manufactured by the present embodiment has a technical structure where the organic semiconductor layer is laminated on the gate insulation layer.

Thus, the organic semiconductor device becomes excellent in alignment stability of the liquid crystalline organic semiconductor material.

An embodiment of the gate insulation layer used in the present embodiment is not particularly limited as long as it allows the layer to have the desired alignment properties, and it is suitably selected according to factors such as an application of the organic semiconductor device manufactured by the manufacturing method of an organic semiconductor device of the present embodiment.

Here, the alignment properties of the gate insulation layer used in the present embodiment are not particularly limited as long as the liquid crystalline organic semiconductor material is aligned, and they are suitably selected according to a type of the liquid crystalline organic semiconductor material. Such alignment properties may be parallel alignment properties to align the liquid crystalline organic semiconductor material on the gate insulation layer in a parallel direction to the gate insulation layer surface, or vertical alignment properties to align the liquid crystalline organic semiconductor material on the gate insulation layer in a vertical direction to the gate insulation layer surface. The gate insulation layer used in the present embodiment may have either of the parallel alignment properties or vertical alignment properties. In particular, it is preferable to have the vertical alignment properties. By using a vertically-aligned alignment film as the gate insulation layer, mobility in the in-plane direction of the organic semiconductor layer transferred to the gate insulation layer is improved. As a result, it becomes possible to improve the transistor performance of an organic semiconductor device manufactured by the present embodiment.

As examples of an aspect of the gate insulation layer used in the present embodiment, the followings are cited: an aspect where a material having the above-mentioned alignment properties is used as the material constituting the gate insulation layer (first aspect of the gate insulation layer), an aspect where a gate insulation layer made of an insulative functional material having insulation properties is formed and the surface thereof is subsequently alignment treated to have the alignment properties (second aspect of the gate insulation layer), and an aspect where an insulation layer formed on the gate electrode and made of an insulative functional material having insulation properties, and an alignment layer formed on the insulation layer and capable of aligning the liquid crystalline organic semiconductor material are laminated (third aspect of the gate insulation layer). In the present embodiment, any one of the above aspects for the gate insulation layer is suitably used.

Hereinafter, each aspect for the gate insulation layer will be explained in turn.

(First Aspect of Gate Insulation Layer)

First, the first aspect of the gate insulation layer will be explained. The gate insulation layer of the present aspect uses a material having the above-mentioned alignment properties as the material constituting the gate insulation layer. The material constituting the gate insulation layer used in the present aspect is not particularly limited as long as the material has the alignment properties and the desired insulation properties. As examples of such material, polyimide, polyamide, polyvinyl alcohol, polyvinyl phenol, polysiloxane, polyester, nylon, and derivatives thereof are cited. Any one of the above is suitably used in the present aspect.

(Second Aspect of Gate Insulation Layer)

Next, the second aspect of the gate insulation layer will be explained. The gate insulation layer of the present aspect is a gate insulation layer made of an insulative functional material having insulation properties is formed and the surface thereof is subsequently alignment treated to have the alignment properties.

The insulative functional material used in the present aspect is not particularly limited as long as it is capable of providing the desired insulation properties to the gate insulation layer. As examples of such insulative material, resin materials such as an acryl type resin, a phenol type resin, a fluorine type resin, an epoxy type resin, a cardo-type resin, a vinyl type resin, an imide type resin, and a novolac resins are cited.

In the present aspect, a method to conduct the alignment treatment to provide the alignment properties to the gate insulation layer surface is not particularly limited as long as it is a treatment method which can align the liquid crystalline organic semiconductor material in the desired form on the gate insulation layer. As examples of such treatment, methods of physically-modifying or chemically-modifying the surface are cited.

As an example of physical-modification, a treatment by ozono-UV or $O_2$ plasma is cited.

As an example of chemical-modification, a treatment using a surface preparation agent such as silane coupling agent is cited. As examples of the surface preparation agent, silylamine compounds such as alkylchlorosilanes, alkylalkoxysilanes, fluorinated alkylchlorosilanes, fluorinated alkylalkoxysilanes, and hexamethyldisilazane are cited. The surface treatment can be carried out by, for example, having the gate insulation layer contact to the solution or gas of the surface preparation agent and adsorbing the surface preparation agent with the gate insulation layer surface. Prior to the surface treatment, the surface of the gate insulation layer, where the surface treatment will be conducted, may be treated with ozono-UV or $O_2$ plasma.

(Third Aspect of Gate Insulation Layer)

Next, the third aspect of the gate insulation layer will be explained. The gate insulation layer of the present aspect comprises the following layers laminated: an insulation layer formed on the gate electrode and made of an insulative functional material having insulation properties, and an alignment layer formed on the insulation layer and capable of aligning the liquid crystalline organic semiconductor material.

The insulative functional material used in the present aspect is not particularly limited as long as it can provide the desired insulation properties to the gate insulation layer. As examples of the insulative resin material, resin materials such as an acryl type resin, a phenol type resin, a fluorine type resin, an epoxy type resin, a cardo-type resin, a vinyl type resin, an imide type resin, and a novolac resins are cited. Further, a thickness of the insulation material formed by such insulative functional material is preferably within the range of 0.01 μm to 5 μm, more preferably within the range of 0.01 μm to 3 μm, and even more preferably within the range of 0.01 μm to 1 μm.

Next, an alignment layer used in the present aspect will be explained. The alignment layer used in the present aspect has a function to align the liquid crystalline organic semiconductor material contained in the above-mentioned organic semiconductor layer of the organic semiconductor layer-transferring substrate.

Hereinafter, such alignment layer will be explained.

The alignment layer used in the present aspect is not particularly limited as long as it can align the liquid crystalline organic semiconductor material and can be appropriately selected according to the type of the liquid crystalline organic semiconductor material. As such alignment layer, a parallel alignment film which aligns the liquid crystalline organic semiconductor material on the alignment layer to a parallel direction to the alignment layer surface, and a vertical alignment film which aligns the liquid crystalline organic semiconductor material on the alignment layer to a vertical direction to the alignment layer surface, are cited.

The parallel alignment film is not particularly limited as long as it can align the liquid crystalline organic semiconductor material to the predetermined direction. As examples of such parallel alignment film, the following can be cited: a rubbing film which can provide a function to align the liquid crystalline organic semiconductor material to the rubbed direction by the rubbing process, and a photo aliment film using a photoreactive material and which can provide a function to align the liquid crystalline organic semiconductor material to the predetermined direction by irradiating polarized light.

As examples of the rubbing film, films made of materials such as polyimide, polyamide, polyvinyl alcohol, polyvinyl phenol, polyester, and nylon can be cited.

Further, as examples of the photo aliment film, films made of materials such as polyimide, polyamide, and poly (vinyl cinnamate) can be cited.

The vertical alignment film is not particularly limited as long as it can align the liquid crystalline organic semiconductor material to the vertical direction to the alignment layer surface. As examples of such vertical alignment film, a film made of materials such as polyimide, a fluorine-based polymer, and a silicon-based polymer can be cited.

Either of the parallel alignment film or vertical alignment film can be used preferably for the alignment layer of the present aspect. Among the above, it is preferable to use the vertical alignment film. By using the vertical alignment film as the alignment layer, mobility in the in-plane direction of the organic semiconductor layer thermal transferred to the alignment layer is improved. As a result, transistor characteristics of an organic semiconductor device manufactured by the present embodiment are improved.

Thickness of the alignment layer used in the present aspect is not particularly limited as long as it can provide the desired alignment function according to factors such as the type of the alignment film used as the alignment layer. In particular, the thickness of the alignment layer used in the present aspect is preferably within the range of 1 nm to 3 μm, more preferably within the range of 1 nm to 1 μm, and further more preferably within the range of 1 nm to 0.5 μm.

(e) Other Structure

The substrate for forming an organic semiconductor device used in the present step comprises at least the substrate, the gate electrode and the gate insulation layer, and may have other technical structure as needed. As examples of the other structure used in the present step, a source electrode and a drain electrode formed so as to contact to the gate insulation layer can be cited.

Figure 5:
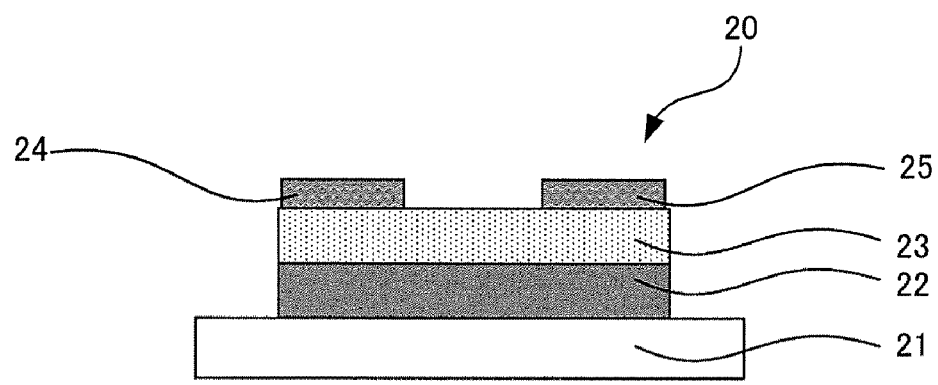
FIG. 5 is a schematic cross-sectional view illustrating one example of the substrate for forming an organic semiconductor device used in the first embodiment for manufacturing method of organic semiconductor device of the present invention.

A case when a source electrode and a drain electrode are formed to the substrate for forming an organic semiconductor device used in the present step will be explained with reference to the drawings. FIG. 5 is a schematic cross-sectional view illustrating one example where a source electrode and a drain electrode are formed in the substrate for forming an organic semiconductor device used in the present step. As shown in FIG. 5, a substrate for forming an organic semiconductor device 20 used in the present step has a source electrode 24 and a drain electrode 25 formed so as to contact to a gate insulation layer 23.

The source electrode and the drain electrode are the same as those used for the organic semiconductor layer-transferring substrate, their explanations here are omitted.

(3) Method of Thermal Transferring the Organic Semiconductor Layer

Next, a method of thermal transferring the organic semiconductor layer from the organic semiconductor layer-transferring substrate to the gate insulation layer of the substrate for forming an organic semiconductor device in the present step will be explained. In the present step, the method of thermal transferring the organic semiconductor layer to the gate insulation layer is conducted by setting the thermal transferring temperature to the liquid crystal phase transition temperature of a liquid crystalline organic semiconductor material contained in the organic semiconductor layer. By setting the thermal transferring temperature at the time of thermal transfer to the liquid crystal phase transition temperature of the liquid crystalline organic semiconductor material contained in the organic semiconductor layer in the present step, it becomes possible to align the liquid crystalline organic semiconductor material when transferring the organic semiconductor layer and also to improve the transferring properties of the organic semiconductor layer from the parting substrate.

In the present step, the method of thermal transferring the organic semiconductor layer to the gate insulation layer can be divided into 3 further steps.

That is, the method of thermal transferring the organic semiconductor layer to the gate insulation layer of the present step can be divided into: a substrate-providing step of providing the organic semiconductor layer-transferring substrate and the substrate for forming an organic semiconductor device so as the organic semiconductor layer and the gate insulation layer contact each other; a thermal transfer step of transferring the organic semiconductor layer to the gate insulation layer by heating the organic semiconductor layer to a liquid crystal phase transition temperature of a liquid crystalline organic semiconductor material; and a parting substrate-peeling step of peeling the parting substrate from the organic semiconductor layer-transferring substrate.

Figure 6A:
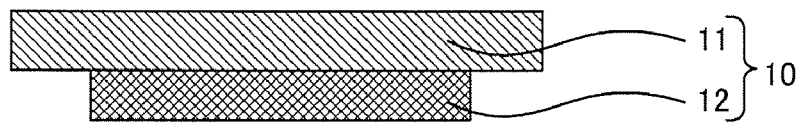
FIGS. 6A to 6C are a schematic view illustrating one example of the organic semiconductor layer-transfer step of the present invention.
Figure 6B:
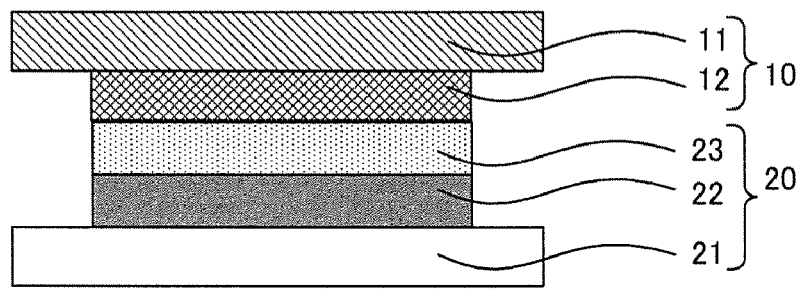
Figure 6C:
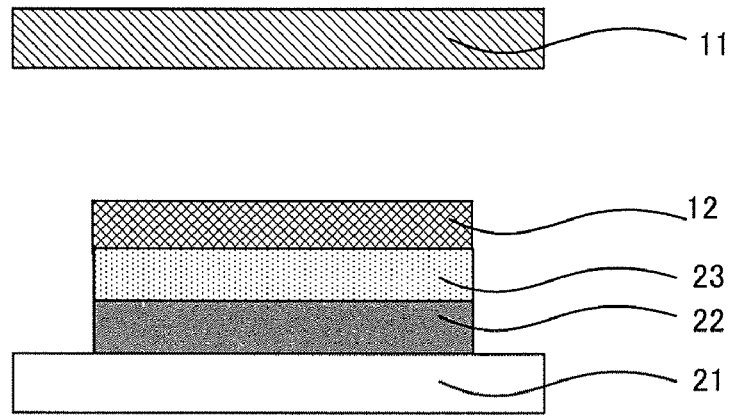

Such thermal transferring method of the present step will be explained with reference to the drawings. FIGS. 6A to 6C are a schematic view illustrating one example of the method of transferring the organic semiconductor layer in the present step. As shown in FIGS. 6A to 6C, the method of thermal transferring the organic semiconductor layer in the present step can be divided into: a substrate-providing step of providing the organic semiconductor layer-transferring substrate and the substrate for forming an organic semiconductor device so as the organic semiconductor layer and the gate insulation layer contact each other (FIG. 6A); a thermal transfer step of transferring the organic semiconductor layer to the gate insulation layer by heating the organic semiconductor layer to a liquid crystal phase transition temperature of a liquid crystalline organic semiconductor material (FIG. 6B); and a parting substrate-peeling step of peeling the parting substrate from the organic semiconductor layer-transferring substrate (FIG. 6C).

Here, the thermal transfer method used in the present step is conducted by heating the organic semiconductor layer to the liquid crystal phase transition temperature of the liquid crystalline organic semiconductor material in the thermal transfer step. As the liquid crystal phase transition temperature is the same as that explained in the above-section "(1) Organic Semiconductor Layer-Transferring Substrate", explanation here is omitted.

In the thermal transfer step, a temperature to thermal transfer the organic semiconductor layer is not particularly limited as long as it is a temperature equivalent to the liquid crystal phase transition temperature. Specific thermal transfer temperature can be appropriately decided according to factors such as the type of liquid crystalline organic semiconductor material.

The embodiment to thermal transfer the organic semiconductor layer to the gate insulation layer in the present step may be an optional embodiment according to factors such as a performance required for an organic semiconductor device manufactured by the present embodiment. As examples of such embodiment, an embodiment where a whole organic semiconductor layer formed on the organic semiconductor layer-transferring substrate is transferred, an embodiment where only a part of the organic semiconductor layer is transferred, and an embodiment where the organic semiconductor layer is transferred in pattern, can be cited.

Figure 7A:
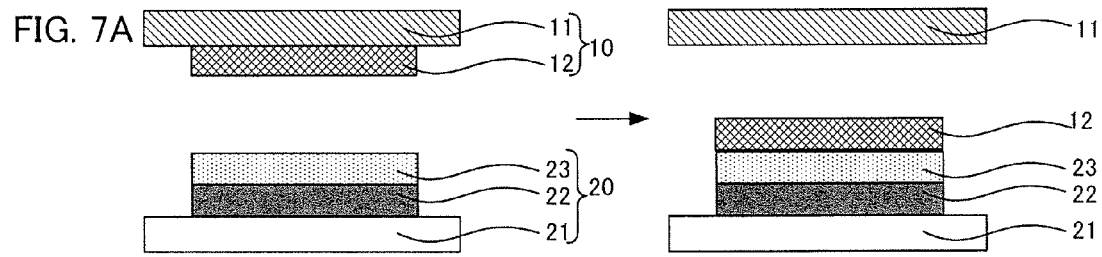
FIGS. 7A to 7C are schematic views each illustrating one example of an embodiment to transfer the organic semiconductor layer in the organic semiconductor layer-transfer step of the present invention.
Figure 7B:
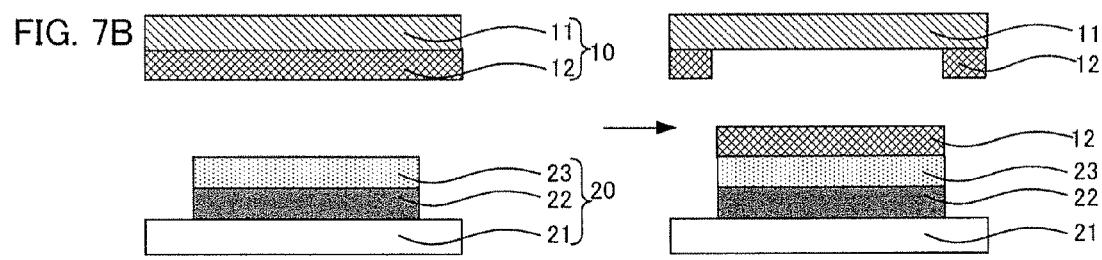
Figure 7C:
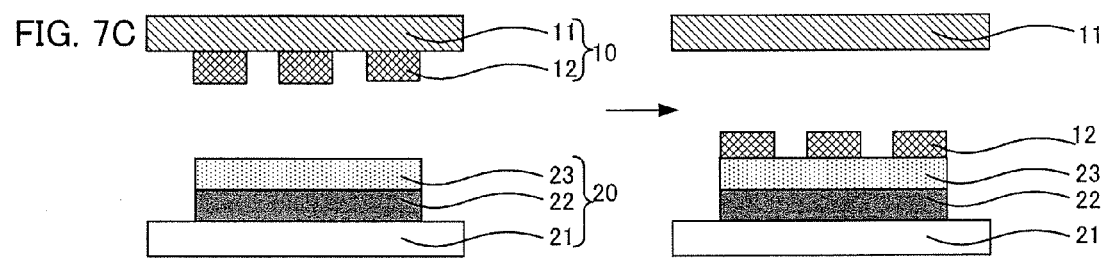

These embodiments to thermal transfer the organic semiconductor layer will be explained with reference to the drawings. FIGS. 7A to 7C are schematic views each illustrating one example of an embodiment to thermal transfer an organic semiconductor layer to a gate insulation layer in the present embodiment. As illustrated in FIGS. 7A to 7C, as examples of the embodiment to thermal transfer the organic semiconductor layer to the gate insulation layer in the present step, the followings can be cited: an embodiment where a whole organic semiconductor layer formed on the organic semiconductor layer-transferring substrate is transferred (FIG. 7A), an embodiment where only a part of the organic semiconductor layer is transferred (FIG. 7B), and an embodiment where the organic semiconductor layer is transferred in pattern (FIG. 7C).

In the present step, any one of the above embodiments can be suitably used. Among the above, it is preferable to use the embodiment where the organic semiconductor layer is transferred to the gate insulation layer in pattern. By taking such an embodiment, a technical structure of an organic semiconductor device manufactured by the present embodiment can be made to a structure where plural organic transistors are provided on a substrate. Accordingly, it is possible to make an organic semiconductor device manufactured by the present embodiment excellent in industrial versatility.

The method of thermal transfer the organic semiconductor layer to the gate insulation layer in pattern is not particularly limited as long as it is capable to thermal transfer the organic semiconductor layer in the desired pattern. As such method, the following methods can be cited for example: a method of heating the organic semiconductor layer in pattern at the time of transferring the organic semiconductor layer, a method of forming the organic semiconductor layer in concavo-convex pattern in the organic semiconductor layer-transferring substrate and thermal transfer only the portions formed in convex portions, and a method of forming the gate insulation layer in concavo-convex pattern and thermal transfer the organic semiconductor layer only to the portions formed in convex portions.

Figure 8A:
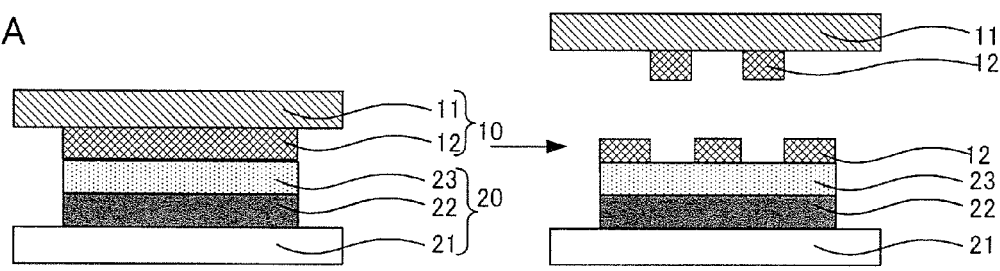
FIGS. 8A to 8C are schematic views each illustrating another example of an embodiment to transfer the organic semiconductor layer in the organic semiconductor layer-transfer step of the present invention.
Figure 8B:
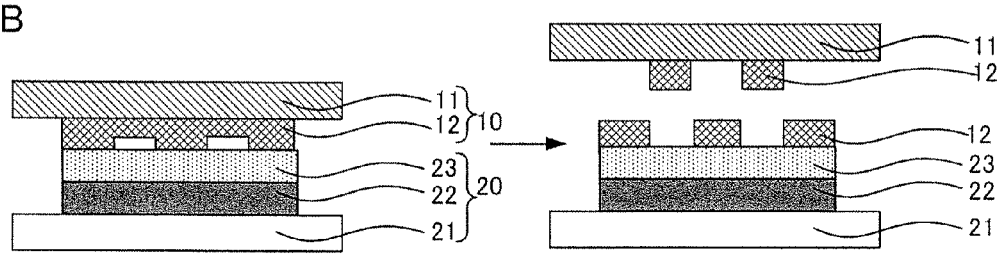
Figure 8C:
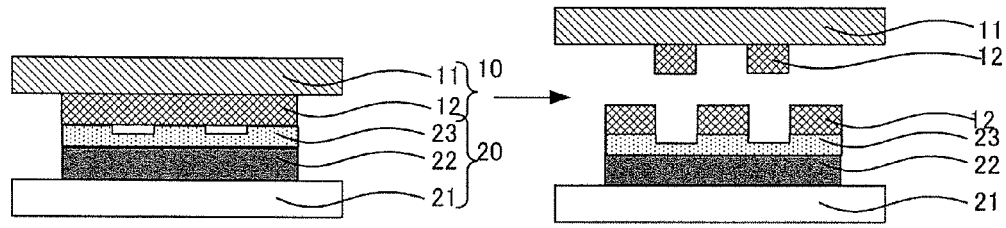

These thermal transfer methods will be explained with reference to the drawings. FIGS. 8A to 8C are schematic views each illustrating one example of a method of thermal transferring an organic semiconductor layer in pattern in the present step. As illustrated in FIGS. 8A to 8C, in the present step, the following examples can be cited for the method to transfer the organic semiconductor layer in pattern: a method of heating the organic semiconductor layer in pattern after providing the organic semiconductor layer-transferring substrate and the substrate for forming an organic semiconductor device in the substrates-providing step (FIG. 8A); a method of forming the organic semiconductor layer in concavo-convex pattern in the organic semiconductor layer-transferring substrate and thermal transfer only the portions formed in convex portions (FIG. 8B), and a method of forming the gate insulation layer in concavo-convex pattern and thermal transfer the organic semiconductor layer only to the portions formed in convex portions (FIG. 8C).

In the present step, any one of the above-mentioned methods can be suitably used. Among, them, the method of pattern-heating the organic semiconductor layer after providing the organic semiconductor layer-transferring substrate and the substrate for forming an organic semiconductor device is preferable, because such method makes it easy to thermally transfer the organic semiconductor layer in more highly-precise pattern.

2. Other Step

The manufacturing method of an organic semiconductor device of the present embodiment comprises at least the organic semiconductor layer-transfer step and may comprise other step as needed. As other step used in the present embodiment, a step which allows formation of a technical structure having the desired function can be appropriately selected according to factors such as an application of an organic semiconductor device manufactured in the present embodiment. As examples of such step, a source/drain electrodes forming step of forming a source electrode and a drain electrode and a passivation layer forming step of forming a passivation layer on an organic semiconductor layer thermal transferred to a gate insulation layer can be cited.

Here, the source/drain electrodes forming step may be carried out in an embodiment where a source electrode and a drain electrode are formed before an organic semiconductor layer-transfer step on a gate insulation layer of a substrate for forming an organic semiconductor device used in the organic semiconductor layer-transfer step, or in an embodiment where a source electrode and a drain electrode are formed on an organic semiconductor layer thermal transferred to a gate insulation layer after the organic semiconductor layer-transfer step.

As examples of a method of forming a source electrode and a drain electrode in the source/drain electrodes forming step, a method of vapor-depositing an inorganic material such as Au, and AG and an organic material having conductivity such as PEDOT/PSS, a coating method, and a transfer method can be cited.

In the passivation layer forming step, a method of forming a passivation layer is not particularly limited as long as it is capable of forming a passivation layer having the desired protection function. In particular, a method of using a passivation layer forming-coating solution where a resin layer is dissolved in a solvent and coating the solution to the organic semiconductor layer is suitably used in the present embodiment. As examples of such methods, the followings are cited: a method of using a printing method and printing the passivation layer forming-coating solution on the organic semiconductor layer in pattern, and a method of forming a non-patterned passivation layer by coating the passivation layer forming-coating solution to the entire surface of the organic semiconductor layer. In the present step, either of the above methods can be suitably used.

B. Second Embodiment for Manufacturing Method of Organic Semiconductor Device

Next, the second embodiment of the manufacturing method of an organic semiconductor device of the present invention will be explained. The manufacturing method of an organic semiconductor device of the present embodiment is to manufacture an organic semiconductor device having a technical structure where a top-gate type organic transistor is provided on a substrate.

In other words, the manufacturing method of an organic semiconductor device of the present embodiment comprises a step of transferring an organic semiconductor layer to a substrate for forming an organic semiconductor device by a thermal transfer at a liquid crystal phase transition temperature of a liquid crystalline organic semiconductor material, and the step uses: an organic semiconductor layer-transferring substrate comprising a parting substrate having parting properties, and the organic semiconductor layer formed on the parting substrate and containing the liquid crystalline organic semiconductor material; and the substrate for forming an organic semiconductor device having alignment properties which are capable of aligning the liquid crystalline organic semiconductor material on a surface of the substrate for forming an organic semiconductor device.

Figure 9:
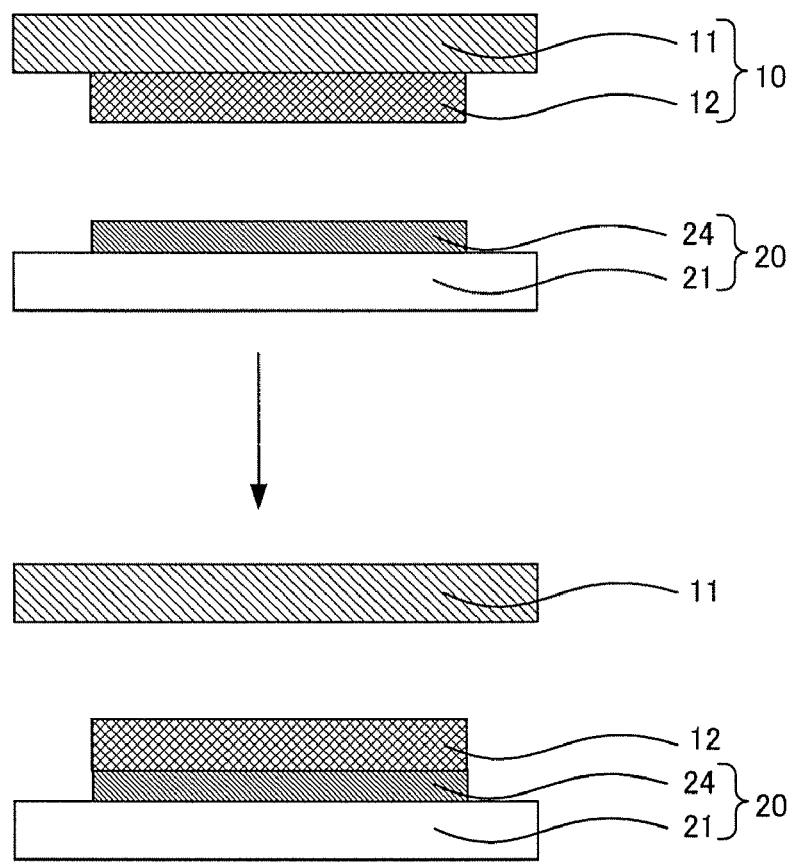
FIG. 9 is a schematic view illustrating one example of the manufacturing method used in the first embodiment for an organic semiconductor device of the present embodiment.

Such manufacturing method of an organic semiconductor device of the present embodiment will be explained with reference to the drawings. FIG. 9 is a schematic view illustrating one example of the manufacturing method of an organic semiconductor device of the present embodiment. As illustrated in FIG. 9, the manufacturing method of an organic semiconductor device of the present embodiment comprises a step of transferring an organic semiconductor layer 12 to a substrate for forming an organic semiconductor device 20 by a thermal transfer, and the step uses: an organic semiconductor layer-transferring substrate 10 comprising a parting substrate 11 having parting properties, the organic semiconductor layer 12 formed on the parting substrate 11 and containing the liquid crystalline organic semiconductor material; and the substrate for forming an organic semiconductor device 20 having alignment properties which are capable of aligning the liquid crystalline organic semiconductor material on the surface of the substrate for forming an organic semiconductor device 20.

In such example, the manufacturing method of an organic semiconductor device of the present embodiment is conducted by setting a temperature at the time of thermal transferring the organic semiconductor layer 12 to the substrate for forming an organic semiconductor device 20 to the liquid crystal phase transition temperature of the liquid crystalline organic semiconductor material in the organic semiconductor layer-transfer step.

According to the present embodiment, the liquid crystalline organic semiconductor material which can be aligned regularly is used as a material to constitute the organic semiconductor layer, and a temperature at the time of thermal transfer during the organic semiconductor layer-transfer step, in which the organic semiconductor layer is thermally transferred to the substrate for forming an organic semiconductor device, is the liquid crystal phase transition temperature of the liquid crystalline organic semiconductor material. Thereby, it becomes possible to transfer a phase of the liquid crystalline organic semiconductor material to the liquid crystal phase at the time of thermal transferring the organic semiconductor layer. As a result, the liquid crystalline organic semiconductor material can be aligned regularly in the organic semiconductor layer after the transfer.

Further, since the transferred organic semiconductor layer is to be provided to the surface of the substrate for forming an organic semiconductor device which has alignment properties, it becomes possible to stabilize the alignment properties of the liquid crystalline organic semiconductor material of the organic semiconductor layer after the transfer.

Moreover, in the present embodiment, by setting a temperature at the time of thermal transferring the organic semiconductor layer to the substrate for forming an organic semiconductor device to the liquid crystal phase transition temperature of the liquid crystalline organic semiconductor material, it becomes possible to improve the parting properties of the organic semiconductor layer from the parting substrate. Accordingly, it becomes possible in the present embodiment to transfer the organic semiconductor layer in highly-precise pattern to the substrate for forming an organic semiconductor device.

As explained, according to the present embodiment, it is possible to manufacture a highly-productive organic semiconductor device having excellent transistor characteristics by transferring the organic semiconductor layer in highly-precise pattern.

The manufacturing method of an organic semiconductor device of the present embodiment comprises at least the organic semiconductor layer-transfer step and may comprise other step as needed.

Hereinafter, each step of the present embodiment will be explained.

1. Organic Semiconductor Layer-Transfer Step

First, an organic semiconductor layer-transfer step of the present embodiment will be explained. The present step is a step of transferring an organic semiconductor layer to a substrate for forming an organic semiconductor device by a transfer at a liquid crystal phase transition temperature of a liquid crystalline organic semiconductor material, and the step uses: an organic semiconductor layer-transferring substrate comprising a parting substrate having parting properties, the organic semiconductor layer formed on the parting substrate and containing the liquid crystalline organic semiconductor material; and the substrate for forming an organic semiconductor device having alignment properties which are capable of aligning the liquid crystalline organic semiconductor material on a surface of the substrate for forming an organic semiconductor device.

Hereinafter, the organic semiconductor layer-transfer step of the present embodiment will be explained in detail.

(1) Organic Semiconductor Layer-Transfer Step

First, the organic semiconductor layer-transferring substrate of the present step will be explained. The organic semiconductor layer-transferring substrate comprises at least a parting substrate having parting properties, and an organic semiconductor layer formed on the parting substrate and containing the liquid crystalline organic semiconductor material.

(a) Organic Semiconductor Layer

The organic semiconductor layer will be explained. The organic semiconductor layer contains the liquid crystalline organic semiconductor material and is to be thermal transferred to the substrate for forming an organic semiconductor device to be explained later in the present step.

Here, as the organic semiconductor layer used in the present embodiment is the same as the above section of "A. First Embodiment for Manufacturing Method of Organic Semiconductor Device", explanation here is omitted.

(b) Parting Substrate

Next, the parting substrate will be explained. The parting substrate used in the present embodiment has parting properties to the above-mentioned organic semiconductor layer.

Here, as the parting substrate used in the present embodiment is the same as that explained in the section of "A. First Embodiment for Manufacturing Method of Organic Semiconductor Device", explanation here is omitted.

(c) Other Structure

The organic semiconductor layer-transferring substrate used in the present step comprises at least the parting substrate and the organic semiconductor layer, and may have other technical structure as needed. As examples of such other technical structure, the followings can be cited: a source electrode and a drain electrode formed so as to contact to the organic semiconductor layer; and a gate insulation layer, gate electrode, and/or a passivation layer formed between the organic semiconductor layer and the parting substrate.

Figure 10A:
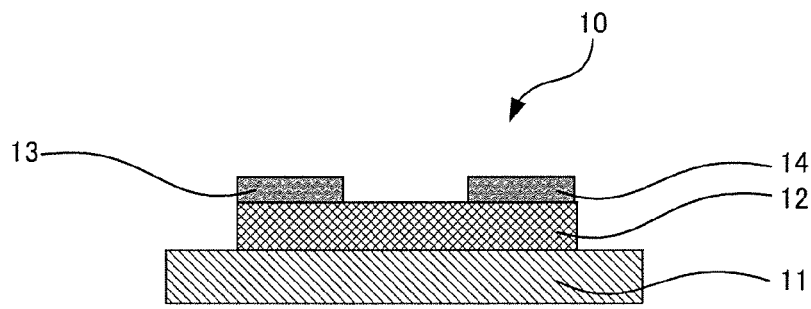
FIGS. 10A to 10D are schematic cross-sectional views each illustrating one example of the organic semiconductor layer-transferring substrate used in the second embodiment for manufacturing method of organic semiconductor device of the present invention.
Figure 10B:
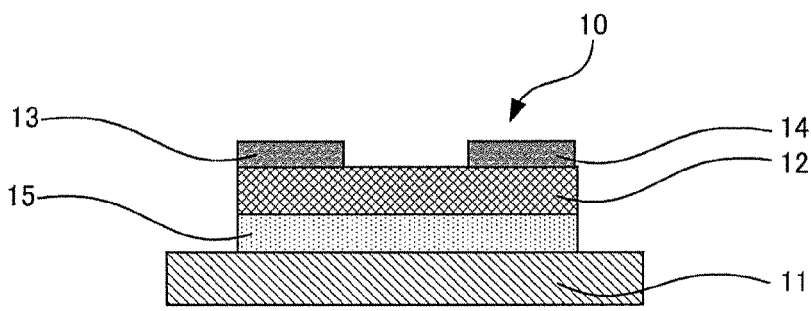
Figure 10C:
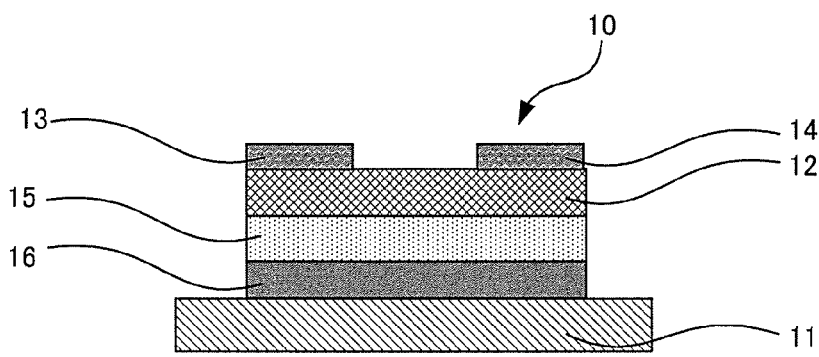
Figure 10D:
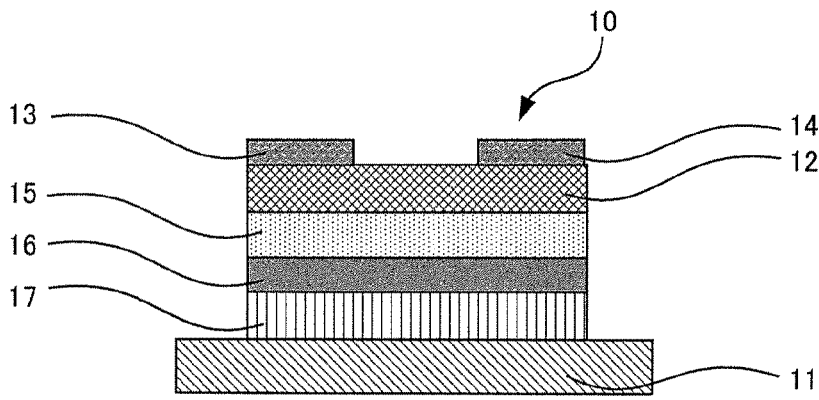

A case when the organic semiconductor layer-transferring substrate has such other technical structure will be explained with reference to the drawings. FIGS. 10A to 10D are schematic cross-sectional views each illustrating one example of a case when a source electrode and a drain electrode are formed on the organic semiconductor layer-transferring substrate of the present step. As shown in FIG. 10A, an organic semiconductor layer-transferring substrate 10 used in the present step may be the organic semiconductor layer-transferring substrate where a source electrode 13 and a drain electrode 14 are formed so as to contact to the organic semiconductor layer 12. Further, in such a case, a gate insulation layer 15 maybe formed between the organic semiconductor layer 12 and a parting substrate 11 (FIG. 10B), a gate electrode 16 may be formed between the gate insulation layer 15 and the parting substrate 11 (FIG. 10C), or a passivation layer 17 may be formed between the gate electrode 16 and the parting substrate 11 (FIG. 10D).

Figure 11A:
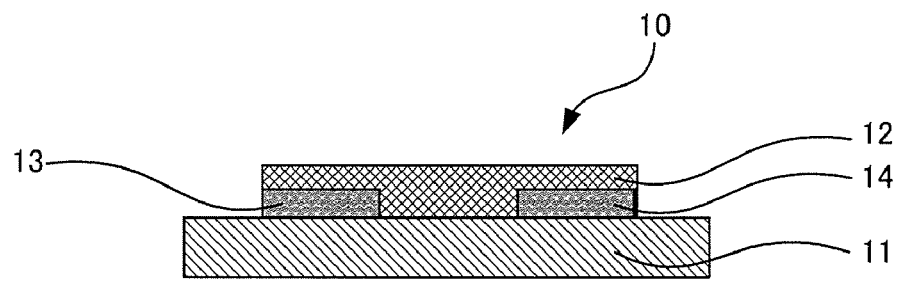
FIGS. 11A to 11D are schematic cross-sectional views each illustrating another example of the organic semiconductor layer-transferring substrate used in the second embodiment for manufacturing method of organic semiconductor device of the present invention.
Figure 11B:
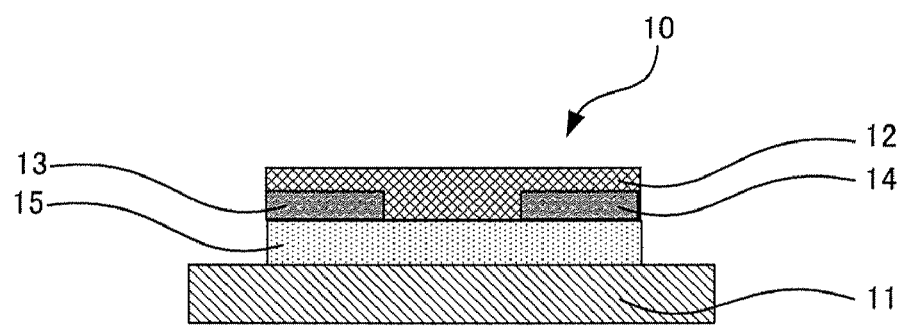
Figure 11C:
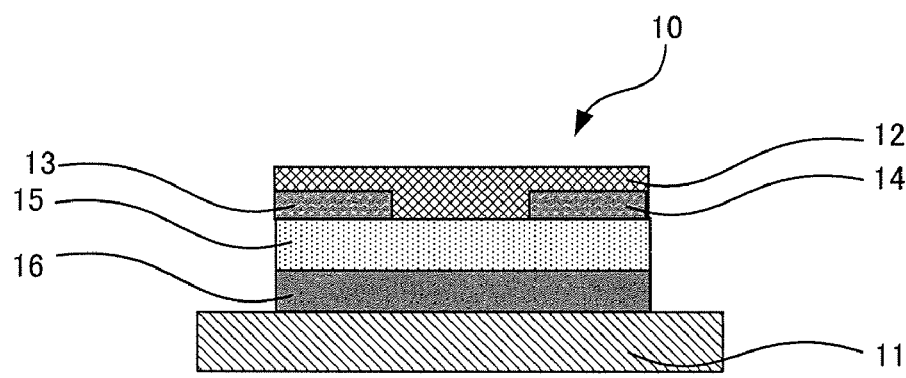
Figure 11D:
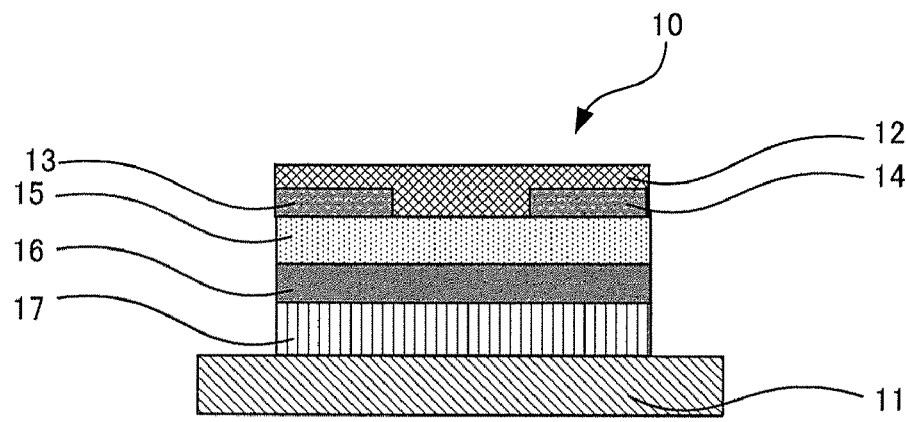

FIGS. 11A to 11D are schematic cross-sectional views each illustrating another example of a case when a source electrode and a drain electrode are formed on the organic semiconductor layer-transferring substrate of the present step. As shown in FIG. 11A, an organic semiconductor layer-transferring substrate 10 may be the organic semiconductor layer-transferring substrate where a source electrode 13 and a drain electrode 14 are formed between a parting substrate 11 and an organic semiconductor layer 12 so as to contact to the organic semiconductor layer 12. Further, in such a case, agate insulation layer 15 may be further formed between the source electrode 13 and drain electrode 14 and a parting substrate 11 (FIG. 11B), a gate electrode 16 may be formed between the gate insulation layer 15 and the parting substrate 11 (FIG. 11C), or a passivation layer 17 may be formed between the gate electrode 16 and the parting substrate 11 (FIG. 11D).

As the source electrode, drain electrode, gate electrode, gate insulation layer, and passivation layer are the same as those explained in the above section "A. First Embodiment for Manufacturing Method of Organic Semiconductor Device", explanations here are omitted.

(2) Substrate for Forming Organic Semiconductor Device

Next, the substrate for forming an organic semiconductor device used in the present embodiment will be explained. The substrate for forming an organic semiconductor device used in the present embodiment has alignment properties which are capable of aligning the liquid crystalline organic semiconductor material on the surface of the substrate for forming an organic semiconductor device. In other words, the manufacturing method of an organic semiconductor device of the present embodiment comprises the organic semiconductor layer-transfer step for thermal transferring the above-mentioned organic semiconductor layer of the organic semiconductor layer-transferring substrate to the substrate for forming an organic semiconductor device, and a thermal transfer temperature is set to the liquid crystal phase transition temperature of a liquid crystalline organic semiconductor material contained in the organic semiconductor layer. Since the substrate for forming an organic semiconductor device used in the present embodiment has a function to regularly align the liquid crystalline organic semiconductor material in the organic semiconductor layer thermal transferred to the substrate for forming an organic semiconductor device, the liquid crystalline organic semiconductor material becomes to have excellent alignment stability.

An aspect of the substrate for forming an organic semiconductor device used in the present embodiment is not particularly limited as long as it is provided with the desired aliment properties, and can be appropriately selected according to factors such as application of an organic semiconductor device manufactured by the manufacturing method of an organic semiconductor device of the present embodiment.

Here, the alignment properties provided to the substrate for forming an organic semiconductor device of the present embodiment are not particularly limited as long as they can align the liquid crystalline organic semiconductor material and can be appropriately selected according to the type of the liquid crystalline organic semiconductor material. Such alignment properties may be parallel alignment properties which align the liquid crystalline organic semiconductor material on the substrate for forming an organic semiconductor device to a parallel direction to the surface of substrate for forming an organic semiconductor device, or vertical alignment properties which align the liquid crystalline organic semiconductor material on the substrate for forming an organic semiconductor device to a vertical direction to the surface of substrate for forming an organic semiconductor device. The substrate for forming an organic semiconductor device used in the present embodiment may have either of the parallel alignment properties or vertical alignment properties. Among the above, it is preferable to have the vertical alignment properties. By using a vertically-aligned alignment layer as the substrate for forming an organic semiconductor device, mobility in the in-plane direction of the organic semiconductor layer thermal transferred to the substrate for forming an organic semiconductor device is improved. As a result, transistor characteristics of an organic semiconductor device manufactured by the present embodiment are improved.

As examples of an aspect of the substrate for forming an organic semiconductor device used in the present embodiment, the followings can be cited: an aspect where a material having the above-mentioned alignment properties is used as the material constituting the substrate for forming an organic semiconductor device (first aspect of the substrate for forming an organic semiconductor device), an aspect where an optional substrate is used and an alignment treatment to provide alignment properties is conducted on the substrate surface (second aspect of the substrate for forming an organic semiconductor device), and an aspect where an optional substrate and an alignment layer formed on the substrate and capable of aligning the liquid crystalline organic semiconductor material are laminated (third aspect of the substrate for forming an organic semiconductor device). In the present embodiment, any one of the above aspects for the substrate for forming an organic semiconductor device is suitably used.

Hereinafter, each aspect for the substrate for forming an organic semiconductor device will be explained in turn.

(First Aspect of Substrate for Forming Organic Semiconductor Device)

First, the first aspect of the substrate for forming an organic semiconductor device will be explained. The substrate for forming an organic semiconductor device of the present aspect uses a material having the above-mentioned alignment properties as the material constituting the substrate for forming an organic semiconductor device. The material constituting the substrate for forming an organic semiconductor device used in the present aspect is not particularly limited as long as the material has the alignment properties. As examples of such material, PET, PEN, PES, PI, PEEK, PC, PPS, and PEI are cited. Any one of the above is suitably used in the present aspect.

(Second Aspect of Substrate for Forming Organic Semiconductor Device)

Next, the second aspect of the substrate for forming an organic semiconductor device will be explained. The substrate for forming an organic semiconductor device of the present aspect uses an optional substrate and an alignment treatment to provide alignment properties is conducted on the substrate surface.

The substrate used in the present aspect is not particularly limited as long as it is possible to conduct an alignment treatment which provides the desired alignment properties. Such substrate can be appropriately selected from, for example, those listed in the above section of "A. First Aspect of Manufacturing Method of Organic Semiconductor Device".

In the present aspect, a method to conduct the alignment treatment to provide the alignment properties to the substrate surface is not particularly limited as long as it is a treatment method which can align the liquid crystalline organic semiconductor material in the desired form on the substrate for forming an organic semiconductor device. As an example of such treatment, a method of physically-modifying or chemically-modifying the surface is cited.

As an example of physical-modification, a treatment by ozono-UV or $O_2$ plasma is cited.

As an example of chemical-modification, a treatment using a surface preparation agent such as silane coupling agent is cited. As examples of the surface preparation agent, silylamine compounds such as alkylchlorosilanes, alkylalkoxysilanes, fluorinated alkylchlorosilanes, fluorinated alkylalkoxysilanes, and hexamethyldisilazane are cited. The surface treatment can be carried out by, for example, having the substrate for forming an organic semiconductor device contact to the solution or gas of the surface preparation agent and adsorbing the surface preparation agent with the substrate for forming an organic semiconductor device surface. Prior to the surface treatment, the surface of the substrate for forming an organic semiconductor device, where the surface treatment will be conducted, may be treated with ozono-UV or $O_2$ plasma.

(Third Aspect of Substrate for forming Organic Semiconductor Device)

Next, the third aspect of the substrate for forming an organic semiconductor device will be explained. The substrate for forming an organic semiconductor device of the present aspect comprises the following layers laminated: an optional substrate, and an alignment layer formed on the substrate and capable of aligning the liquid crystalline organic semiconductor material.

(a) Substrate

First, the substrate will be explained. The substrate used in the present aspect supports an alignment layer or the like.

Here, the substrate used in the present aspect is the same as that explained in the above section "A. First Embodiment for Manufacturing Method of Organic Semiconductor Device", and thus explanation here is omitted.

(b) Alignment Layer

Next, an alignment layer used in the present aspect will be explained. The alignment layer used in the present aspect has a function of aligning the liquid crystalline organic semiconductor material contained in the above-mentioned organic semiconductor layer of the organic semiconductor layer-transferring substrate.

Here, the alignment layer used in the present aspect is also the same as that explained in the above section "A. First Embodiment for Manufacturing Method of Organic Semiconductor Device", and thus explanation here is omitted.

(c) Other Structure

The substrate for forming an organic semiconductor device used in the present step may have other technical structure as needed.

As examples of such other structure, a source electrode and a drain electrode can be cited.

Figure 12:
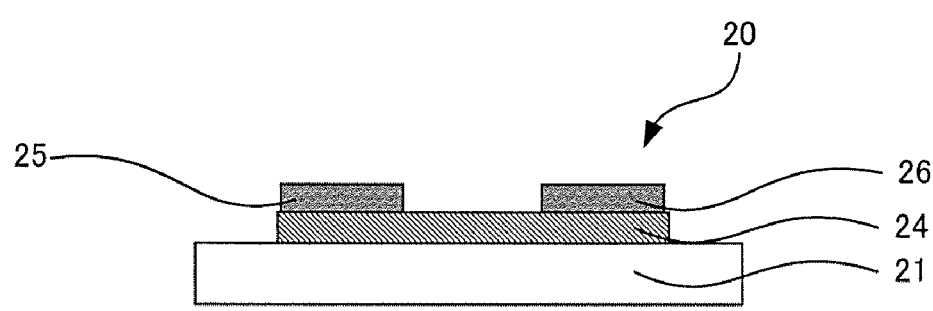
FIG. 12 is a schematic cross-sectional view illustrating one example of the substrate for forming an organic semiconductor device used in the second embodiment for manufacturing method of organic semiconductor device of the present invention.
Figure 13A:
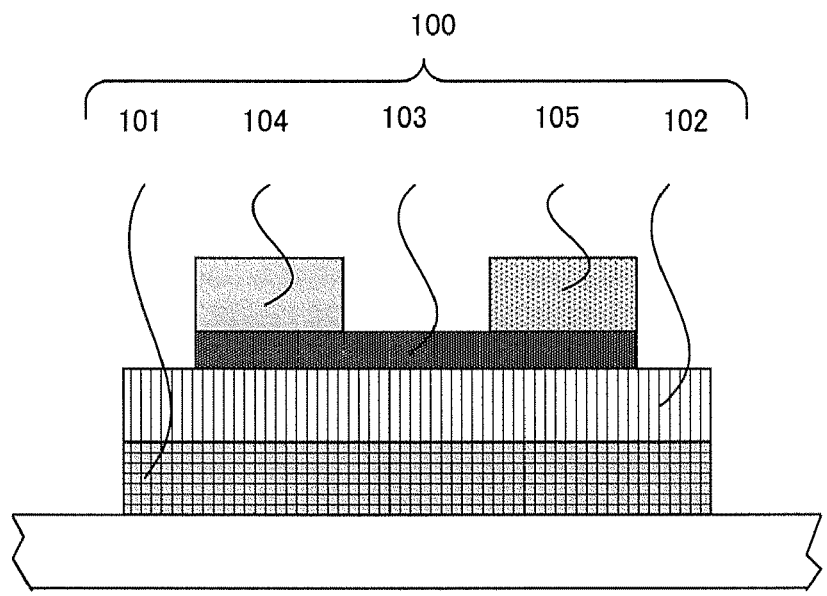
FIGS. 13A and 13B are schematic views each illustrating one example of a general semiconductor transistor.
Figure 13B:
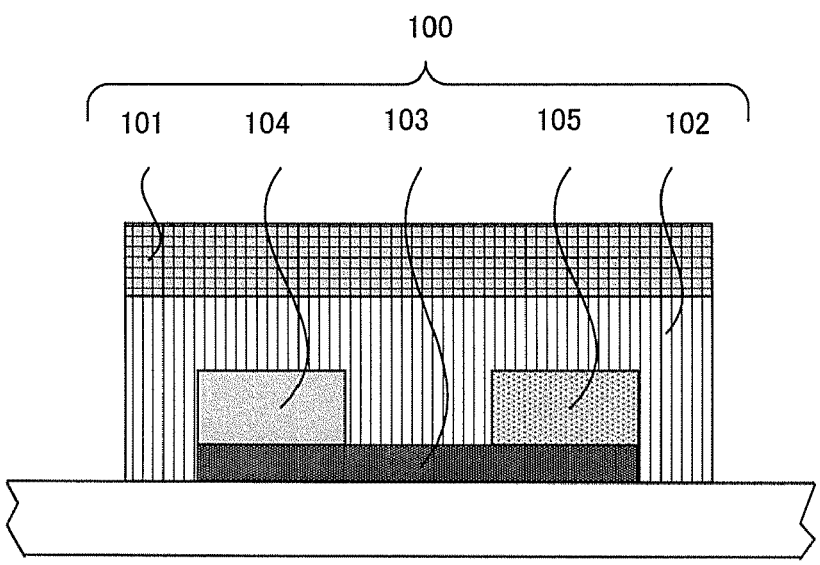

A case where a source electrode and a drain electrode are formed in the substrate for forming an organic semiconductor device used in the present step will be explained with reference to the drawings. FIG. 12 is a schematic cross-sectional view illustrating one example of a case where a source electrode and a drain electrode are formed in the substrate for forming an organic semiconductor device used in the present step. As shown in FIG. 12, a substrate for forming an organic semiconductor device 20 used in the present step may be the substrate for forming an organic semiconductor device where a source electrode 24 and a drain electrode 25 are formed.

As the source electrode and drain electrode are the same as those explained above, explanations here are omitted.

(3) Thermal Transfer Method of Organic Semiconductor Layer

The method of thermal transferring the organic semiconductor layer to the substrate for forming an organic semiconductor device in the present step is to set a thermal transfer temperature to the liquid crystal phase transition temperature of a liquid crystalline organic semiconductor material contained in the organic semiconductor layer.

Here, the method of thermal transferring the organic semiconductor layer to the substrate for forming an organic semiconductor device in the present step is the same as that explained in the above section "A. First Embodiment for Manufacturing Method of Organic Semiconductor Device", and thus explanations here are omitted.

2. Other Step

The manufacturing method of an organic semiconductor device of the present embodiment comprises at least the organic semiconductor layer-transfer step and may contain other step as needed. As the other step used in the present embodiment, a step which can form a technical structure having the desired function can be suitably selected according to factors such as an application of the organic semiconductor device manufactured by the present embodiment. As examples of such step, a source/drain electrodes forming step which forms a source electrode and a drain electrode, a gate electrode forming step of forming a gate electrode, a gate insulation layer formation step of forming a gate insulation layer, and a passivation layer forming step of forming a passivation layer can be cited.

Here, the source/drain electrodes forming step may be conducted in an embodiment where a source electrode and a drain electrode are formed on the substrate for forming an organic semiconductor device used in the organic semiconductor layer-transfer step prior to the organic semiconductor layer-transfer step, or an embodiment where a source electrode and a drain electrode are formed on the organic semiconductor layer thermal transferred to the substrate for forming an organic semiconductor device after the organic semiconductor layer-transfer step.

Here, the respective methods of forming the source electrode and drain electrode, gate electrode, and passivation layer in the respective source/drain electrodes forming step, gate electrode forming step, gate insulation layer forming step, passivation layer forming step are the same as those explained in the above section "A. First Embodiment for Manufacturing Method of Organic Semiconductor Device", and thus explanations here are omitted.

The present invention is not limited to the above embodiments. The above-described embodiments are mere examples, and those having substantially the same structure as technical ideas described in the appended claims and providing similar effects are included in the scope of the present invention.

EXAMPLES

Next, the present invention will be further explained by way of examples and comparative examples.

1. Example 1

(1) Liquid Crystal Phase Identification/Phase Transition Temperature Confirmatory Experiment To confirm a liquid crystal phase and a phase transition temperature of a liquid crystalline organic semiconductor material 5,5'''-Dioctyl-2,2':5',2":5",2'''-Quaterthiophene (hereinafter, "8-QTP-8"), texture observation under a polarizing microscope (manufactured by Olympus Corporation, BH2-UMA®) using a heating stage (manufactured by Mettler-Toledo International Inc., FP82HT®, FP80HT®) and DSC (Differential Scanning calorimeter, manufactured by NETZSCH, DSC204 µ—Sensor®) measurement were carried out, and results of Iso 175.6, SmG 80.6 Cryst. (° C.) were obtained.

(2) Manufacture of Organic Semiconductor Layer-Transferring Substrate

<Manufacture of Parting Substrate>

A solution of 0.4 wt % TefonAF® (manufactured by Du Pont Kabushiki Kaisha) FC-40 Fluorinert® (manufactured by Sumitomo 3M Limited) was coated on a PEN substrate of 0.125 mm thickness by a spin coating (500 rpm, 10 seconds→1000 rpm, 20 seconds) so as a thickness became 2.0 µm, and the resultant was dried at 150° C. for 30 minutes.

<Formation of Organic Semiconductor Layer>

The liquid crystalline organic semiconductor material 8-QTP-8 was vapor-deposited by a vacuum deposition method onto the parting substrate until the thickness became 40 nm, and an organic semiconductor layer was thereby formed.

(3) Manufacture of Substrate for Forming Organic Semiconductor Device

<Substrate>

An n-heavily-doped silicon wafer of 0.6 mm thickness having a silicon oxide layer of about 3000 Å (300 nm) thickness attached thereto was used as a substrate. The n-heavily-doped silicon portions functioned as a gate electrode, the silicon oxide layer worked as a gate dielectric, and its capacitance was about 11 nF/cm² (nanofarad/square centimeter).

<Formation of Gate Insulation Layer>

The substrate was immersed into a dehydrated toluene solution of n-Octyltrichlorosilane (OTS) of 0.1M at 60° C. for 20 minutes. Subsequently, the wafer was washed with toluene, acetone, isopropyl alcohol and the residual liquid was removed by a nitrogen spray gun. The resultant was dried at 100° C. for 1 hour and thereby a gate insulation layer having alignment properties to vertically align the liquid crystalline organic semiconductor material on its surface was obtained.

(4) Organic Semiconductor Layer-Transfer Step

The organic semiconductor layer-transferring substrate and the substrate for forming an organic semiconductor device were attached, and the organic semiconductor layer was transferred from the organic semiconductor layer-transferring substrate to the substrate for forming an organic semiconductor device using a thermal transferring device (GLM350R6® manufactured by GBC) at roller temperature of 80° C.

(5) Source/Drain Electrodes Forming Step

Next, source and drain electrodes of gold were vacuum vapor deposited to the organic semiconductor layer via a shadow mask having W (width)=1000 µm, L (length)=50 µm, and thickness=50 nm. Thereby, a bottom-gate/top contact type transistor was manufactured.

2. Example 2

An organic semiconductor device was manufactured in the same manner as in Example 1 except that roller temperature in the organic semiconductor layer-transfer step was set to 100° C.

3. Example 3

An organic semiconductor device was manufactured in the same manner as in Example 1 except that roller temperature in the organic semiconductor layer-transfer step was set to 120° C.

4. Example 4

An organic semiconductor device was manufactured in the same manner as in Example 1 except that roller temperature in the organic semiconductor layer-transfer step was set to 140° C.

5. Example 5

An organic semiconductor device was manufactured in the same manner as in Example 1 except that roller temperature in the organic semiconductor layer-transfer step was set to 160° C.

6. Comparative Example 1

An organic semiconductor device was manufactured in the same manner as in Example 1 except that roller temperature in the organic semiconductor layer-transfer step was set to 25° C.

7. Comparative Example 2

An organic semiconductor device was manufactured in the same manner as in Example 1 except that roller temperature in the organic semiconductor layer-transfer step was set to 40° C.

8. Comparative Example 3

An organic semiconductor device was manufactured in the same manner as in Example 1 except that roller temperature in the organic semiconductor layer-transfer step was set to 60° C.

9. Example 6

(1) Manufacture of Organic Semiconductor Layer-Transferring Substrate

An organic semiconductor layer-transferring substrate was manufactured in the same manner as in Example 1.

(2) Manufacture of Substrate for Forming Organic Semiconductor Device

<Substrate>

An n-heavily-doped silicon wafer of 0.6 mm thickness having a silicon oxide layer of about 3000 Å (300 nm) thickness attached thereto was used as a substrate. The n-heavily-doped silicon portions functioned as a gate electrode, the silicon oxide layer worked as a gate dielectric, and its capacitance was about 11 nF/cm$^2$ (nanofarad/square centimeter).

<Formation of Gate Insulation Layer>

The substrate was immersed into a dehydrated toluene solution of Phenyltrichlorosilane (PTS) of 0.1M at 60° C. for 20 minutes. Subsequently, the wafer was washed with toluene, acetone, isopropyl alcohol and the residual liquid was removed by a nitrogen spray gun. The resultant was dried at 100° C. for 1 hour and thereby a gate insulation layer having alignment properties to horizontally align the liquid crystalline organic semiconductor material on its surface was obtained.

(4) Organic Semiconductor Layer-Transfer Step

The organic semiconductor layer-transferring substrate and the substrate for forming an organic semiconductor device were attached, and the organic semiconductor layer was transferred from the organic semiconductor layer-transferring substrate to the substrate for forming an organic semiconductor device using a thermal transferring device (GLM350R6® manufactured by GBC) at roller temperature of 80° C.

(5) Source/Drain Electrodes Forming Step

Next, source and drain electrodes of gold were vacuum vapor deposited to the organic semiconductor layer via a shadow mask having W (width)=1000 μm, L (length)=50 μm, and thickness=50 nm. Thereby, a bottom-gate/top contact type transistor was manufactured.

10. Example 7

An organic semiconductor device was manufactured in the same manner as in Example 6 except that roller temperature in the organic semiconductor layer-transfer step was set to 100° C.

11. Example 8

An organic semiconductor device was manufactured in the same manner as in Example 6 except that roller temperature in the organic semiconductor layer-transfer step was set to 120° C.

12. Example 9

An organic semiconductor device was manufactured in the same manner as in Example 6 except that roller temperature in the organic semiconductor layer-transfer step was set to 140° C.

13. Example 10

An organic semiconductor device was manufactured in the same manner as in Example 6 except that roller temperature in the organic semiconductor layer-transfer step was set to 160° C.

14. Comparative Example 4

An organic semiconductor device was manufactured in the same manner as in Example 6 except that roller temperature in the organic semiconductor layer-transfer step was set to 25° C.

15. Comparative Example 5

An organic semiconductor device was manufactured in the same manner as in Example 6 except that roller temperature in the organic semiconductor layer-transfer step was set to 40° C.

16. Comparative Example 6

An organic semiconductor device was manufactured in the same manner as in Example 6 except that roller temperature in the organic semiconductor layer-transfer step was set to 60° C.

1. Example 11

(1) Liquid Crystal Phase Identification/Phase Transition Temperature Confirmatory Experiment To confirm a liquid crystal phase and a phase transition temperature of a liquid crystalline organic semiconductor material 5,5''-Dioctyl-2,2':5',2''-Terthiophene (hereinafter, "8-TTP-8"), texture observation under a polarizing microscope (manufactured by Olympus Corporation, BH2-UMA®) using a heating stage (manufactured by Mettler-Toledo International Inc., FP82HT®, FP80HT®) and DSC (Differential Scanning calorimeter, manufactured by NETZSCH, DSC204μ—Sensor®) measurement were carried out, and results of Iso 90.4, SmC 87.6, SmF 72.6, SmG 59.3 Cryst. (° C.) were obtained.

(1) Manufacture of Organic Semiconductor Layer-Transferring Substrate

An organic semiconductor layer-transferring substrate was manufactured in the same manner as in Example 1 except that 8-TTP-8 was used as the liquid crystalline organic semiconductor material.

(2) Manufacture of Substrate for Forming Organic Semiconductor Device

A substrate for forming an organic semiconductor device was manufactured in the same manner as in Example 1.

(4) Organic Semiconductor Layer-Transfer Step

The organic semiconductor layer-transferring substrate and the substrate for forming an organic semiconductor device were attached, and the organic semiconductor layer was transferred from the organic semiconductor layer-transferring substrate to the substrate for forming an organic semiconductor device using a thermal transferring device (GLM350R6® manufactured by GBC) at roller temperature of 60° C.

(5) Source/Drain Electrodes Forming Step

Next, source and drain electrodes of gold were vacuum vapor deposited to the organic semiconductor layer via a shadow mask having W (width)=1000 μm, L (length)=50 μm, and thickness=50 nm. Thereby, a bottom-gate/top contact type transistor was manufactured.

18. Example 12

An organic semiconductor device was manufactured in the same manner as in Example 1 except that roller temperature in the organic semiconductor layer-transfer step was set to 70° C.

19. Example 13

An organic semiconductor device was manufactured in the same manner as in Example 1 except that roller temperature in the organic semiconductor layer-transfer step was set to 80° C.

20. Example 14

An organic semiconductor device was manufactured in the same manner as in Example 1 except that roller temperature in the organic semiconductor layer-transfer step was set to 90° C.

21. Comparative Example 7

An organic semiconductor device was manufactured in the same manner as in Example 1 except that roller temperature in the organic semiconductor layer-transfer step was set to 30° C.

22. Comparative Example 8

An organic semiconductor device was manufactured in the same manner as in Example 1 except that roller temperature in the organic semiconductor layer-transfer step was set to 40° C.

23. Comparative Example 9

An organic semiconductor device was manufactured in the same manner as in Example 1 except that roller temperature in the organic semiconductor layer-transfer step was set to 50° C.

24. Comparative Example 10

An organic semiconductor device was manufactured in the same manner as in Example 1 except that roller temperature in the organic semiconductor layer-transfer step was set to 100° C.

25. Comparative Example 11

An organic semiconductor device was manufactured in the same manner as in Example 1 except that roller temperature in the organic semiconductor layer-transfer step was set to 110° C.

26. Example 15

(1) Manufacture of Organic Semiconductor Layer-Transferring Substrate

An organic semiconductor layer-transferring substrate was manufactured in the same manner as in Example 6 except that 8-TTP-8 was used as the liquid crystalline organic semiconductor material.

(2) Manufacture of Substrate for Forming Organic Semiconductor Device
<Substrate>

An n-heavily-doped silicon wafer of 0.6 mm thickness having a silicon oxide layer of about 3000 Å (300 nm) thickness attached thereto was used as a substrate. The n-heavily-doped silicon portions functioned as a gate electrode, the silicon oxide layer worked as a gate dielectric, and its capacitance was about 11 $nF/cm^2$ (nanofarad/square centimeter).
<Formation of Gate Insulation Layer>

The substrate was immersed into a dehydrated toluene solution of Phenyltrichlorosilane (PTS) of 0.1M at 60° C. for 20 minutes. Subsequently, the wafer was washed with toluene, acetone, isopropyl alcohol and the residual liquid was removed by a nitrogen spray gun. The resultant was dried at 100° C. for 1 hour and thereby a gate insulation layer having alignment properties to horizontally align the liquid crystalline organic semiconductor material on its surface was obtained.

(4) Organic Semiconductor Layer-Transfer Step

The organic semiconductor layer-transferring substrate and the substrate for forming an organic semiconductor device were attached, and the organic semiconductor layer was transferred from the organic semiconductor layer-transferring substrate to the substrate for forming an organic semiconductor device using a thermal transferring device (GLM350R6® manufactured by GBC) at roller temperature of 60° C.

(5) Source/Drain Electrodes Forming Step

Next, source and drain electrodes of gold were vacuum vapor deposited to the organic semiconductor layer via a shadow mask having W (width)=1000 μm, L (length)=50 μm, and thickness=50 nm. Thereby, a bottom-gate/top contact type transistor was manufactured.

27. Example 16

An organic semiconductor device was manufactured in the same manner as in Example 6 except that roller temperature in the organic semiconductor layer-transfer step was set to 70° C.

28. Example 17

An organic semiconductor device was manufactured in the same manner as in Example 6 except that roller temperature in the organic semiconductor layer-transfer step was set to 80° C.

29. Example 18

An organic semiconductor device was manufactured in the same manner as in Example 6 except that roller temperature in the organic semiconductor layer-transfer step was set to 90° C.

30. Comparative Example 12

An organic semiconductor device was manufactured in the same manner as in Example 6 except that roller temperature in the organic semiconductor layer-transfer step was set to 30° C.

31. Comparative Example 13

An organic semiconductor device was manufactured in the same manner as in Example 6 except that roller temperature in the organic semiconductor layer-transfer step was set to 40° C.

32. Comparative Example 14

An organic semiconductor device was manufactured in the same manner as in Example 6 except that roller temperature in the organic semiconductor layer-transfer step was set to 50° C.

33. Comparative Example 15

An organic semiconductor device was manufactured in the same manner as in Example 6 except that roller temperature in the organic semiconductor layer-transfer step was set to 100° C.

36. Comparative Example 16

An organic semiconductor device was manufactured in the same manner as in Example 6 except that roller temperature in the organic semiconductor layer-transfer step was set to 110° C.

35. Example 19

(1) Liquid Crystal Phase Identification/Phase Transition Temperature Confirmatory Experiment To confirm a liquid crystal phase and a phase transition temperature of a liquid crystalline organic semiconductor material 5,5'''-Dioctyl-2,2':5',2":5",2'''-Quaterthiophene (hereinafter, "8-QTP-8"), texture observation under a polarizing microscope (manufactured by Olympus Corporation, BH2-UMA®) using a heating stage (manufactured by Mettler-Toledo International Inc., FP82HT®, FP80HT®) and DSC (Differential Scanning calorimeter, manufactured by NETZSCH, DSC204µ—Sensor®) measurement were carried out, and results of Iso 175.6, SmG 80.6 Cryst. (° C.) were obtained.

(2) Manufacture of Organic Semiconductor Layer-Transferring Substrate

<Manufacture of Parting Substrate>

A solution of 0.4 wt % TefonAF® (manufactured by Du Pont Kabushiki Kaisha) FC-40 Fluorinert® (manufactured by Sumitomo 3M Limited) was coated on a PEN substrate of 0.125 mm thickness by a spin coating (500 rpm, 10 seconds→1000 rpm, 20 seconds) so as a thickness became 2.0 µm, and the resultant was dried at 150° C. for 30 minutes.

<Formation of Organic Semiconductor Layer>

The liquid crystalline organic semiconductor material 8-QTP-8 was vapor-deposited by a vacuum deposition method onto the parting substrate until the thickness became 200 nm, and an organic semiconductor layer was thereby formed.

(3) Manufacture of Substrate for Forming Organic Semiconductor Device

<Substrate>

An n-heavily-doped silicon wafer of 0.6 mm thickness having a silicon oxide layer of about 3000 Å (300 nm) thickness attached thereto was used as a substrate. The n-heavily-doped silicon portions functioned as a gate electrode, the silicon oxide layer worked as a gate dielectric, and its capacitance was about 11 nF/cm$^2$ (nanofarad/square centimeter).

<Formation of Gate Insulation Layer>

The substrate was immersed into a dehydrated toluene solution of n-Octyltrichlorosilane (OTS) of 0.1M at 60° C. for 20 minutes. Subsequently, the wafer was washed with toluene, acetone, isopropyl alcohol and the residual liquid was removed by a nitrogen spray gun. The resultant was dried at 100° C. for 1 hour and thereby a gate insulation layer having alignment properties to vertically align the liquid crystalline organic semiconductor material on its surface was obtained.

(4) Source/Drain Electrodes Forming Step

Next, source and drain electrodes of gold were vacuum vapor deposited to the gate insulation layer via a shadow mask having W (width)=1000 µm, L (length)=50 µm, and thickness=50 nm.

(5) Organic Semiconductor Layer-Transfer Step

The organic semiconductor layer-transferring substrate and the substrate for forming an organic semiconductor device were attached, and the organic semiconductor layer was transferred from the organic semiconductor layer-transferring substrate to the substrate for forming an organic semiconductor device using a thermal transferring device (GLM350R6® manufactured by GBC) at roller temperature of 80° C. Thereby, a bottom-gate/bottom contact type transistor was manufactured.

36. Example 20

An organic semiconductor device was manufactured in the same manner as in Example 19 except that roller temperature in the organic semiconductor layer-transfer step was set to 100° C.

37. Example 21

An organic semiconductor device was manufactured in the same manner as in Example 19 except that roller temperature in the organic semiconductor layer-transfer step was set to 120° C.

38. Example 22

An organic semiconductor device was manufactured in the same manner as in Example 19 except that roller temperature in the organic semiconductor layer-transfer step was set to 140° C.

39. Example 23

An organic semiconductor device was manufactured in the same manner as in Example 19 except that roller temperature in the organic semiconductor layer-transfer step was set to 160° C.

40. Comparative Example 17

An organic semiconductor device was manufactured in the same manner as in Example 19 except that roller temperature in the organic semiconductor layer-transfer step was set to 25° C.

41. Comparative Example 18

An organic semiconductor device was manufactured in the same manner as in Example 19 except that roller temperature in the organic semiconductor layer-transfer step was set to 40° C.

42. Comparative Example 19

An organic semiconductor device was manufactured in the same manner as in Example 19 except that roller temperature in the organic semiconductor layer-transfer step was set to 60° C.

43. Example 24

(1) Liquid Crystal Phase Identification/Phase Transition Temperature Confirmatory Experiment To confirm a liquid crystal phase and a phase transition temperature of a liquid crystalline organic semiconductor material 5,5"-Dioctyl-2,2':5',2"-Terthiophene (hereinafter, "8-TTP-8"), texture observation under a polarizing microscope (manufactured by Olympus Corporation, BH2-UMA®) using a heating stage (manufactured by Mettler-Toledo International Inc., FP82HT®, FP80HT®) and DSC (Differential Scanning calorimeter, manufactured by NETZSCH, DSC204µ—Sensor®) measurement were carried out, and results of Iso 90.4, SmC 87.6, SmF 72.6, SmG 59.3 Cryst. (° C.) were obtained.

(1) Manufacture of Organic Semiconductor Layer-Transferring Substrate

An organic semiconductor layer-transferring substrate was manufactured in the same manner as in Example 1 except that 8-TTP-8 was used as the liquid crystalline organic semiconductor material.

(2) Manufacture of Substrate for Forming Organic Semiconductor Device

A substrate for forming an organic semiconductor device was manufactured in the same manner as in Example 1.

(3) Source/Drain Electrodes Forming Step

Next, source and drain electrodes of gold were vacuum vapor deposited to the gate insulation layer via a shadow mask having W (width)=1000 μm, L (length)=50 μm, and thickness=50 nm.

(4) Organic Semiconductor Layer-Transfer Step

The organic semiconductor layer-transferring substrate and the substrate for forming an organic semiconductor device were attached, and the organic semiconductor layer was transferred from the organic semiconductor layer-transferring substrate to the substrate for forming an organic semiconductor device using a thermal transferring device (GLM350R6® manufactured by GBC) at roller temperature of 60° C. Thereby, a bottom-gate/bottom contact type transistor was manufactured.

44. Example 25

An organic semiconductor device was manufactured in the same manner as in Example 24 except that roller temperature in the organic semiconductor layer-transfer step was set to 70° C.

45. Example 26

An organic semiconductor device was manufactured in the same manner as in Example 24 except that roller temperature in the organic semiconductor layer-transfer step was set to 80° C.

46. Example 27

An organic semiconductor device was manufactured in the same manner as in Example 24 except that roller temperature in the organic semiconductor layer-transfer step was set to 90° C.

47. Comparative Example 20

An organic semiconductor device was manufactured in the same manner as in Example 24 except that roller temperature in the organic semiconductor layer-transfer step was set to 30° C.

48. Comparative Example 21

An organic semiconductor device was manufactured in the same manner as in Example 24 except that roller temperature in the organic semiconductor layer-transfer step was set to 40° C.

49. Comparative Example 22

An organic semiconductor device was manufactured in the same manner as in Example 24 except that roller temperature in the organic semiconductor layer-transfer step was set to 50° C.

50. Comparative Example 23

An organic semiconductor device was manufactured in the same manner as in Example 24 except that roller temperature in the organic semiconductor layer-transfer step was set to 100° C.

51. Comparative Example 24

An organic semiconductor device was manufactured in the same manner as in Example 24 except that roller temperature in the organic semiconductor layer-transfer step was set to 110° C.

52. Evaluation

Transistor characteristics of each organic semiconductor device manufactured in the examples and comparative examples are evaluated. The evaluation of transistor characteristics was conducted using 237 HIGH VOLTAGE SOURCE MEASUREMENT UNIT® manufactured by Keithley Instruments Inc. Carrier mobility (μ) was calculated by the following formula from data of the saturated region (gate voltage $V_G$<source/drain Voltage $V_{SD}$). In the formula, $I_{SD}$ is drain current, W and L are each a width and length of the semiconductor channel, Ci is capacitance per unit area of the gate dielectric layer, $V_G$ and $V_T$ are each are gate voltage and threshold voltage in the saturated region. The value $V_T$ of this device was obtained from the relation between the square root of $I_{SD}$ in the saturated region and the $V_G$ of the device obtained by extrapolating $I_{SD}$=0 from the measured data.

$$I_{SD} = Ci\mu(W/2L)(V_G - V_T)^2$$

Evaluation results are shown in Tables 1 to 6. The hole mobility in Tables 1 to 4 are average values obtained from 5 or more transistors. The measuring conditions were as follows: the gate voltage $V_g$ of +50 V to −80 V and the voltage between source/drain electrodes $V_{sd}$ of −80 V were applied in atmosphere.

TABLE 1

| | Organic Semiconductor Layer Transfer Temperature (° C.) | Phase | Hole Mobility (cm²/Vs) OTS Process |
|---|---|---|---|
| Comparative Example 1 | 25 | Crystal | 0.0686 |
| Comparative Example 2 | 40 | Crystal | 0.0564 |
| Comparative Example 3 | 60 | Crystal | 0.0582 |
| Example 1 | 80 | Liquid Crystal (SmG) | 0.1417 |
| Example 2 | 100 | Liquid Crystal (SmG) | 0.1483 |
| Example 3 | 120 | Liquid Crystal (SmG) | 0.1420 |
| Example 4 | 140 | Liquid Crystal (SmG) | 0.1276 |
| Example 5 | 160 | Liquid Crystal (SmG) | 0.1313 |

TABLE 2

| Organic Semiconductor Layer Transfer Temperature (° C.) | Phase | Hole Mobility (cm²/Vs) PTS Process |
|---|---|---|
| Comparative Example 4 | 25 | Crystal | 0.0996 |
| Comparative Example 5 | 40 | Crystal | 0.0998 |
| Comparative Example 6 | 60 | Crystal | 0.0981 |
| Example 6 | 80 | Liquid Crystal (SmG) | 0.0966 |
| Example 7 | 100 | Liquid Crystal (SmG) | 0.0857 |
| Example 8 | 120 | Liquid Crystal (SmG) | 0.0601 |
| Example 9 | 140 | Liquid Crystal (SmG) | 0.0586 |
| Example 10 | 160 | Liquid Crystal (SmG) | 0.0604 |

TABLE 3

| | Organic Semiconductor Layer Transfer Temperature (° C.) | Phase | Hole Mobility (cm²/Vs) OTS Process |
|---|---|---|---|
| Comparative Example 7 | 30 | Crystal | 0.0155 |
| Comparative Example 8 | 40 | Crystal | 0.0160 |
| Comparative Example 9 | 50 | Crystal | 0.0181 |
| Example 11 | 60 | Liquid Crystal (SmG) | 0.0219 |
| Example 12 | 70 | Liquid Crystal (SmG) | 0.0286 |
| Example 13 | 80 | Liquid Crystal (SmF) | 0.0348 |
| Example 14 | 90 | Liquid Crystal (SmC) | 0.0314 |
| Comparative Example 10 | 100 | Isotropic | 0.0171 |
| Comparative Example 11 | 110 | Isotropic | Nontransferable |

TABLE 4

| | Organic Semiconductor Layer Transfer Temperature (° C.) | Phase | Hole Mobility (cm²/Vs) PTS Process |
|---|---|---|---|
| Comparative Example 12 | 30 | Crystal | 0.0156 |
| Comparative Example 13 | 40 | Crystal | 0.0135 |
| Comparative Example 14 | 50 | Crystal | 0.0106 |
| Example 15 | 60 | Liquid Crystal (SmG) | 0.0161 |
| Example 16 | 70 | Liquid Crystal (SmG) | 0.0167 |
| Example 17 | 80 | Liquid Crystal (SmF) | 0.0171 |
| Example 18 | 90 | Liquid Crystal (SmC) | 0.0157 |
| Comparative Example 15 | 100 | Isotropic | 0.0170 |
| Comparative Example 16 | 110 | Isotropic | Nontransferable |

TABLE 5

| | Organic Semiconductor Layer Transfer Temperature (° C.) | Phase | Hole Mobility (cm²/Vs) OTS Process |
|---|---|---|---|
| Comparative Example 17 | 25 | Crystal | Nontransferable |
| Comparative Example 18 | 40 | Crystal | Nontransferable |
| Comparative Example 19 | 60 | Crystal | Nontransferable |
| Example 19 | 80 | Liquid Crystal (SmG) | Nontransferable |
| Example 20 | 100 | Liquid Crystal (SmG) | 0.0065 |
| Example 21 | 120 | Liquid Crystal (SmG) | 0.0133 |
| Example 22 | 140 | Liquid Crystal (SmG) | 0.0233 |
| Example 23 | 160 | Liquid Crystal (SmG) | 0.0374 |

TABLE 6

| | Organic Semiconductor Layer Transfer Temperature (° C.) | Phase | Hole Mobility (cm²/Vs) OTS Process |
|---|---|---|---|
| Comparative Example 20 | 30 | Crystal | Nontransferable |
| Comparative Example 21 | 40 | Crystal | Nontransferable |
| Comparative Example 22 | 50 | Crystal | 0.0022 |
| Example 24 | 60 | Liquid Crystal (SmG) | 0.0162 |
| Example 25 | 70 | Liquid Crystal (SmG) | 0.0425 |
| Example 26 | 80 | Liquid Crystal (SmF) | 0.0430 |
| Example 27 | 90 | Liquid Crystal (SmC) | 0.0523 |
| Comparative Example 23 | 100 | Isotropic | 0.0323 |
| Comparative Example 24 | 110 | Isotropic | 0.0227 |

The invention claimed is:

1. A manufacturing method of an organic semiconductor device comprising a step of transferring an organic semiconductor layer to a gate insulation layer by a thermal transfer at a liquid crystal phase transition temperature of a liquid crystalline organic semiconductor material, and the step uses:
    an organic semiconductor layer-transferring substrate comprising a parting substrate having a parting property, and the organic semiconductor layer formed on the parting substrate and containing the liquid crystalline organic semiconductor material; and
    a substrate for forming an organic semiconductor device comprising a substrate, a gate electrode formed on the substrate, and the gate insulation layer formed to cover the gate electrode and having an alignment property which is capable of aligning the liquid crystalline organic semiconductor material on a surface of the gate insulation layer,
    wherein the organic semiconductor layer-transfer step further comprises steps of:
    a substrate-providing step of providing the organic semiconductor layer and the gate insulation layer so as they contact each other;

a thermal transfer step of transferring the organic semiconductor layer to the gate insulation layer by heating the organic semiconductor layer to the liquid crystal phase transition temperature of the liquid crystalline organic semiconductor material; and a parting substrate-peeling step of peeling the parting substrate from the organic semiconductor layer-transferring substrate.

2. A manufacturing method of an organic semiconductor device comprising a step of transferring an organic semiconductor layer to a substrate for forming an organic semiconductor device by a thermal transfer at a liquid crystal phase transition temperature of a liquid crystalline organic semiconductor material, and the step uses:

an organic semiconductor layer-transferring substrate comprising a parting substrate having a parting property, and the organic semiconductor layer formed on the parting substrate and containing the liquid crystalline organic semiconductor material; and the substrate for forming an organic semiconductor device having an alignment property which is capable of aligning the liquid crystalline organic semiconductor material on a surface of the substrate for forming an organic semiconductor device, wherein the organic semiconductor layer-transfer step further comprises steps of:

a substrate-providing step of providing the organic semiconductor layer and the substrate for forming an organic semiconductor device so as they contact each other;

a thermal transfer step of transferring the organic semiconductor layer to the substrate for forming an organic semiconductor device by heating the organic semiconductor layer to the liquid crystal phase transition temperature of the liquid crystalline organic semiconductor material; and a parting substrate-peeling step of peeling the parting substrate from the organic semiconductor layer-transferring substrate.

3. The manufacturing method of an organic semiconductor device according to claim 1, wherein the gate insulation layer is capable of vertically-aligning the liquid crystalline organic semiconductor material on the surface of the gate insulation layer.

4. The manufacturing method of an organic semiconductor device according to claim 2, wherein the substrate for forming an organic semiconductor device is capable of vertically-aligning the liquid crystalline organic semiconductor material on the surface of the substrate for forming an organic semiconductor device.

5. The manufacturing method of an organic semiconductor device according to claim 1, wherein a surface of the parting substrate has a lower surface energy than a surface energy of the surface of the gate insulation layer.

6. The manufacturing method of an organic semiconductor device according to claim 3, wherein a surface of the parting substrate has a lower surface energy than a surface energy of the surface of the gate insulation layer.

7. The manufacturing method of an organic semiconductor device according to claim 2, wherein a surface of the parting substrate has a lower surface energy than a surface energy of the surface of the substrate for forming an organic semiconductor device.

8. The manufacturing method of an organic semiconductor device according to claim 4, wherein a surface of the parting substrate has a lower surface energy than a surface energy of the surface of the substrate for forming an organic semiconductor device.

9. The manufacturing method of an organic semiconductor device according to claim 1, wherein the organic semiconductor layer-transfer step is to thermally transfer the organic semiconductor layer in pattern.

10. The manufacturing method of an organic semiconductor device according to claim 2, wherein the organic semiconductor layer-transfer step is to thermally transfer the organic semiconductor layer in pattern.

* * * * *